United States Patent
Benitez et al.

(10) Patent No.: US 8,101,855 B2
(45) Date of Patent: Jan. 24, 2012

(54) OPTICAL CONCENTRATOR, ESPECIALLY FOR SOLAR PHOTOVOLTAICS

(75) Inventors: Pablo Benitez, Madrid (ES); Juan Carlos Miñano, Madrid (ES); Maikel Hernandez, Madrid (ES); Aleksandra Cvetkovic, Madrid (ES); William A. Parkyn, Jr., Lomita, CA (US)

(73) Assignee: Light Prescriptions Innovators, LLC, Altadena, CA (US)

( * ) Notice: Subject to any disclaimer, the term of this patent is extended or adjusted under 35 U.S.C. 154(b) by 173 days.

(21) Appl. No.: 12/075,830

(22) Filed: Mar. 14, 2008

(65) Prior Publication Data

US 2008/0223443 A1 Sep. 18, 2008

Related U.S. Application Data

(60) Provisional application No. 60/894,896, filed on Mar. 14, 2007.

(51) Int. Cl.
*H01L 31/00* (2006.01)
*G02B 17/00* (2006.01)

(52) U.S. Cl. ........................ 136/259; 359/727
(58) Field of Classification Search .................. 136/259; 359/727

See application file for complete search history.

(56) References Cited

U.S. PATENT DOCUMENTS

| 4,108,019 A * | 8/1978 | Martin ............................ 74/469 |
| 4,275,950 A * | 6/1981 | Meyer ........................... 126/698 |
| 4,425,905 A | 1/1984 | Mori .............................. 126/425 |
| 5,365,920 A | 11/1994 | Lechner ........................ 126/696 |
| 5,465,708 A | 11/1995 | Goebel et al. ................. 126/635 |
| 6,541,694 B2 * | 4/2003 | Winston et al. ............... 136/246 |
| 6,717,045 B2 * | 4/2004 | Chen ............................. 136/246 |
| 6,775,460 B2 * | 8/2004 | Steiner et al. ................. 385/146 |
| 2005/0051205 A1 * | 3/2005 | Mook, Jr. ...................... 136/255 |

FOREIGN PATENT DOCUMENTS

JP 02066505 A * 3/1990

OTHER PUBLICATIONS

Gross, Herbert, "Handbook of Optical Systems", 2007, Wiley-VCH, pp. 242-243.*
Minano et al. "New method of design of nonimaging concentrators", Jun. 1992, Applied Optics, vol. 31, No. 16, pp. 3051-3060.*
Honmo, Hiroshi, JP 02066505A—English abstract.*
Mohedano, Ruben et al., "Design, construction and measurement of a Dielectric-Single Mirror Two Stage (DSMTS) photovoltaic concentrator", 2002, Nonimaging Optics: Maximum Efficiency Light Transfer VI, Roland Winston, Editors, Proceedings of SPIE vol. 4446, pp. 20-31.*

* cited by examiner

*Primary Examiner* — Basia Ridley
*Assistant Examiner* — Tamir Ayad
(74) *Attorney, Agent, or Firm* — Drinker Biddle & Reath LLP

(57) ABSTRACT

In one embodiment of a solar concentrator, a tailored aspheric lens augments the solar-concentrator performance of a concave mirror, widening its acceptance angle for easier solar tracking, making it more cost-competitive for ultra-large arrays. The molded-glass secondary lens also includes a short rod for reducing the peak concentration on a photovoltaic cell that is optically bonded to the end of the rod. The Simultaneous Multiple Surface method produces lens shapes suitable for a variety of medium and high concentrations by mirrored dishes. Besides the rotationally symmetric parabolic mirror itself, other aspheric deviations therefrom are described, including a free-form rectangular mirror that has its focal region at its edge.

20 Claims, 17 Drawing Sheets

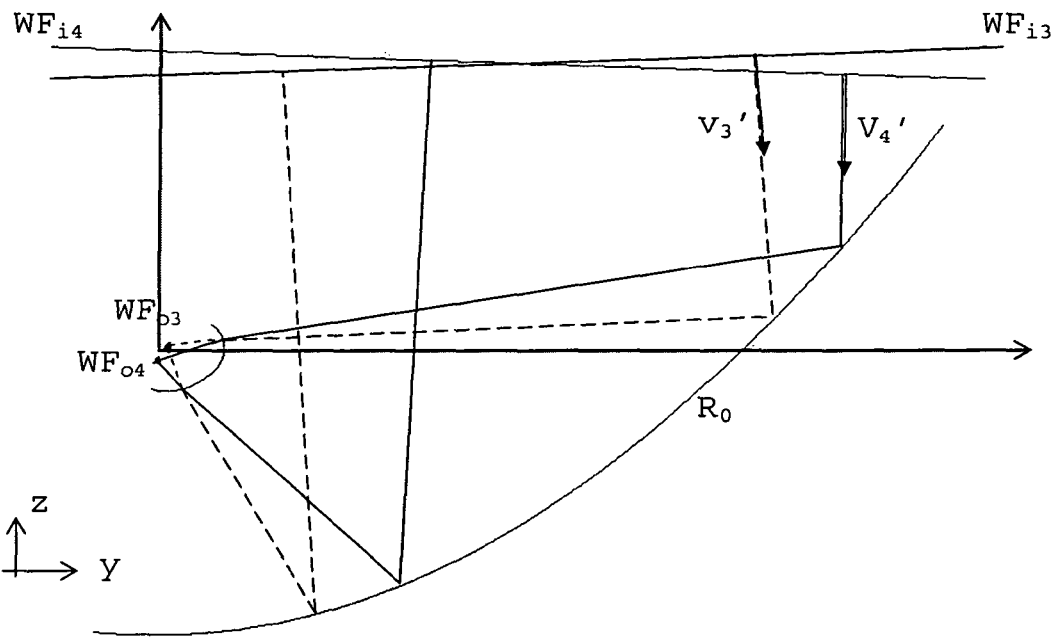
FIG. 29
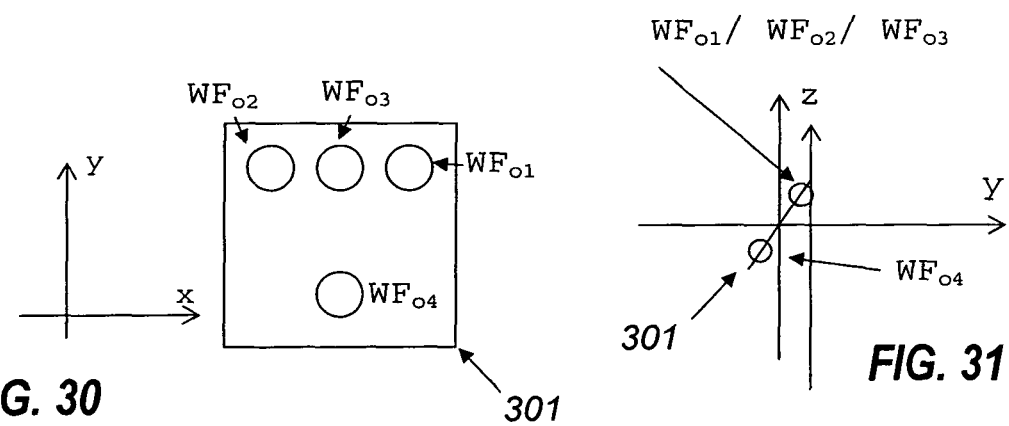
FIG. 30
FIG. 31

OPTICAL CONCENTRATOR, ESPECIALLY FOR SOLAR PHOTOVOLTAICS

CROSS REFERENCE TO RELATED APPLICATIONS

This application claims benefit of U.S. Provisional patent application Ser. No. 60/894,896 filed Mar. 14, 2007, which is incorporated herein by reference in its entirety.

TECHNICAL FIELD

The present invention relates generally to the concentration of optical radiation, more particularly of sunlight, and specifically for advanced high-concentration photovoltaic cells.

BACKGROUND

The present invention relates especially, but not exclusively, to the concentration of sunlight, and to the use of such concentration with advanced high-concentration photovoltaic cells. The present concentrators can also be used as collimators for a variety of light sources, especially light emitting diodes, including an array of light emitting diodes.

The highest efficiency in photovoltaic cells currently commercially available has been achieved by the triple-junction designs of the Spectro-Lab Corporation, but they are too expensive to use without optical concentration, except for the space-power applications for which they were originally developed. "Concentration" is the gathering of light rays so that the light falls at a higher intensity on a smaller area. Two-dimensional concentration for terrestrial solar power generation requires solar tracking, because concentrators rely on the incident light rays being substantially parallel and usually aligned in a known direction relative to the concentrator. Concentration is only effective on clear days, when direct-beam sunlight predominates. In cloudy weather there can be little or no concentration. Consequently, in climates with a high proportion of cloudy weather only silicon cells, less than half as efficient, are affordable. Direct sunlight may be treated as substantially uniform illumination from a circular source at infinity of angular diameter 0.530.

It is also desirable to be able to focus and concentrate radiation from an area just surrounding the visible sun disk, which is known as the circumsolar radiation. This radiation comes from a region surrounding the sun within an annular ring from 0.53° (the direct beam cone) to approximately 40 in diameter. The circumsolar radiation can be as much as 5 to 10% of the total energy from the sun. It is typically at its highest level when there is very light cloud cover over the sun (with high humidity) and at its lowest levels (on the order of 0.1%) when there are very clear sky conditions (with low humidity). In order to capture the circumsolar radiation a wide acceptance angle concentrator is needed.

The scale and magnitude planned for the Solar America Initiative of the United States Department of Energy highlights the great need for continual performance improvements and cost reductions in solar energy generators. While distributed household systems will be fixed flat panels, large-scale utility systems will most likely utilize tracking concentrators, because the high cost of the most efficient, triple-junction cells mandates their use at the highest geometric concentration they can withstand (about 1000 suns, given proper heat-sinking).

Such concentration also requires accurate two-axis tracking, but tracking systems become more expensive if an accuracy of one-degree maximum angular error is required, as is the case for conventional Fresnel lenses and parabolic mirrors. Such angular accuracy affects all the tolerances in the system: optical surface manufacturing accuracy and finish, precision of assembly, the stiffness of the supporting structure, and the mechanical accuracy of the tracker.

SUMMARY OF THE INVENTION

According to an embodiment of the invention, there is provided a concentrator comprising a smoothly curved concave primary mirror arranged to receive collimated incident light and reflect the incident light to a primary focal region, a smoothly curved secondary refracting lens disposed at the primary focal region of the primary mirror, the secondary lens comprising a rear surface and a front surface to receive the reflected light and refract the light towards the rear surface, and a photovoltaic cell or other transducer optically adhered to the rear surface of the secondary lens to receive the refracted light.

The photovoltaic cell may be optically adhered directly to the rear surface of the secondary lens, or to a distal end of a light-conducting rod projecting from the rear surface.

According to another embodiment of the invention, there is provided a concentrator comprising a concave primary mirror arranged to reflect collimated incident light to a primary focal region, a secondary refracting lens disposed at the primary focal region of the primary mirror, the secondary lens comprising a rear surface with a light-conducting rod projecting therefrom and a front surface to receive the reflected light and refract the light towards the light conducting rod, and an optical transducer optically adhered to a distal end of the light conducting rod to receive the refracted light.

In general, a concentrator may be a photovoltaic concentrator wherein the optical transducer is a photovoltaic cell, a collimating emitter wherein the optical transducer is a light source, or both. The photovoltaic concentrator may be suitable for use as a solar power generator. At the surface of the Earth, that implies a gross power received at the primary mirror of about 1 kW/m$^2$ at full power.

Embodiments of the present invention include a solar photovoltaic optical concentrator that can achieve a larger acceptance angle at a given concentration than the prior art, and can thus be more tolerant of tracking error, a key cost parameter. Embodiments of the present invention can also have more tolerance to figural errors in the optical surfaces than the prior art, an important aspect of reducing manufacturing costs. These benefits can be provided by a secondary lens placed at the focal region of a primary mirror, which may be paraboloidal or quasi-paraboloidal, aimed at the sun. The actual photovoltaic cell may optically adhere to the rear of the secondary lens. By adhering the cell directly to the material of the lens, so that the cell is effectively immersed in a dielectric, it is possible to increase tracking tolerance and reduce reflections by the cell.

In a further preferred embodiment, the cell is optically adhered to the end of a short transparent rod, preferably glass, which can be molded in one piece with the aspheric lens. The rod may be mirror-coated in a secondary operation so that wider-angle rays that enter the rod but would miss the photovoltaic cell are reflected onto the cell. Alternatively, the rod may reflect by total internal reflection, alone or in combination with a separate reflector separated from the rod by a narrow air (or low-index dielectric) gap. A rod of suitable length can defocus the reflected rays away from the solar image formed by direct rays. In an embodiment, the cell is just long enough to produce a desired degree of defocusing. For example, in one embodiment a rod with a length of ¾ of the width of the cell, 0.75 cm for a 1 cm cell, can reduce peak concentration to only 50% above the mean, where the same geometry without this contrast-reducing rod could produce a peak concentration of 10 times the average concentration, and the cell and the cell performance and reliability would degrade unless the average concentration was uneconomically derated.

In some embodiments, the secondary lens is mounted at the center of a glass cover spanning the aperture of the primary mirror and together with it forming an enclosure for protection of the mirror-coating from the elements. There is a drawback, however, that this central location of the photovoltaic cell means that the electrical leads from the cell will block some sunlight. However, in some embodiments, in order for multiple concentrators to be arrayed closely in rows, the rotationally symmetric primary mirror and secondary lens are both truncated to a square shape. A further preferred embodiment is also a square, but with the focal region at its edge. For best performance, the optical surfaces of the primary and secondary optical elements are "free form" (not having rotational symmetry), although particularly the primary mirror could also be approximated by an off-axis rotational surface for easier manufacturing. This enables thermal and electrical paths for two adjacent concentrators to pass downwards between the mirrors, without blocking any sunlight.

Another embodiment of the invention provides a photovoltaic collector comprising one or more platforms rotatable in azimuth carrying a plurality of devices rotatable in altitude about parallel axes, each said device comprising a plurality of photovoltaic concentrators according to the invention arrayed along the altitude axis.

Another embodiment of the invention provides a method of designing a concentrator, comprising defining an initial point for a concave primary mirror to collect and reflect collimated incident light from an external source, defining an initial point for a secondary lens to collect light reflected by the primary mirror, defining a target area on a side of the secondary lens towards the external source, constructing the shape of the mirror by tracing rays through parts of the lens already constructed, and constructing the shape of the lens by tracing rays through parts of the mirror already constructed between the target and the source in such a manner as to maintain constant optical path length between wavefronts at apertures defined by the mirror and the target, the wavefronts being selected from flat wavefronts entering the apertures and circular wavefronts centered on edges of the apertures, and designing a light-conducting rod extending from the target area towards the external source, the rod having a length no greater than twice its minimum width at the target area, and being of constant width or narrowing towards the external source.

The concentrator may be designed in two dimensions using rays in an axial plane including a principal optical axis wherein the shapes of the mirror and the lens are constructed as lines in the axial plane. Optical surfaces may then be generated by rotating the constructed lines about the principal optical axis, and selecting parts of the surfaces of rotation.

Another embodiment of the invention provides a method of manufacturing a concentrator, comprising designing a concentrator by a method according to the invention, and constructing a concentrator in accordance with the design.

Where the concentrator is a photovoltaic concentrator, the method of manufacture may further comprise providing a photovoltaic cell at the distal end of the rod to receive light from the target area.

According to a further embodiment of the invention, there is provided a concentrator produced or producible by a method according to the invention.

Commonly owned U.S. Pat. No. 6,639,733 with overlapping inventorship discloses general methods of designing an optical system that are used for embodiments of the primary mirror and secondary lens of the present invention. Commonly owned U.S. Patent Application 20050086032 with overlapping inventorship discloses general methods of designing the free-form primary mirror and secondary lens. Both are incorporated herein by reference in their entirety.

As may be seen from the examples below, embodiments of the present invention permit a solar concentrator with an acceptance half-angle or maximum angular error of at least 1.5°, and in a further embodiment at least approximately 1.8°. The acceptance half-angle is defined as the angle from an optimal or central alignment at which the transmission of incident energy to the photovoltaic cell drops to 90% of the transmission at the central alignment, calculated in 3 dimensions using a convolution of an accurate model of the emission from the sun and an accurate model of the concentrator transmission function. A larger acceptance angle allows greater tolerance on manufacturing and operating accuracies throughout the system. Additionally, such a system can concentrate a sizable portion of the circumsolar radiation. In addition, in embodiments of the invention the square of the maximum angular error times the concentration is constant, so for a given maximum angular error, those embodiments can provide a higher concentration and a corresponding reduction in the area of the high-efficiency high-cost solar cell.

Embodiments of the present invention make it possible to construct small concentrators suitable for land-thrifty deployment.

BRIEF DESCRIPTION OF THE DRAWINGS

The above and other aspects, features and advantages of the present invention will be more apparent from the following more particular description thereof, presented in conjunction with the following drawings wherein:

FIG. 29 shows the selected wavefronts that are used for generation of the seed rib for the SMS-3D algorithm of FIG. 27.

FIGS. 30 and 31 show the relative position of the input wavefronts respect to the cell for the SMS-3D algorithm of FIG. 27, projected onto the 0z and 0x planes.

DETAILED DESCRIPTION OF THE DRAWINGS

A better understanding of the features and advantages of the present invention will be obtained by reference to the following detailed description of the invention and accompanying drawings, which set forth illustrative embodiments in which the principles of the invention are utilized.

Figure 2:
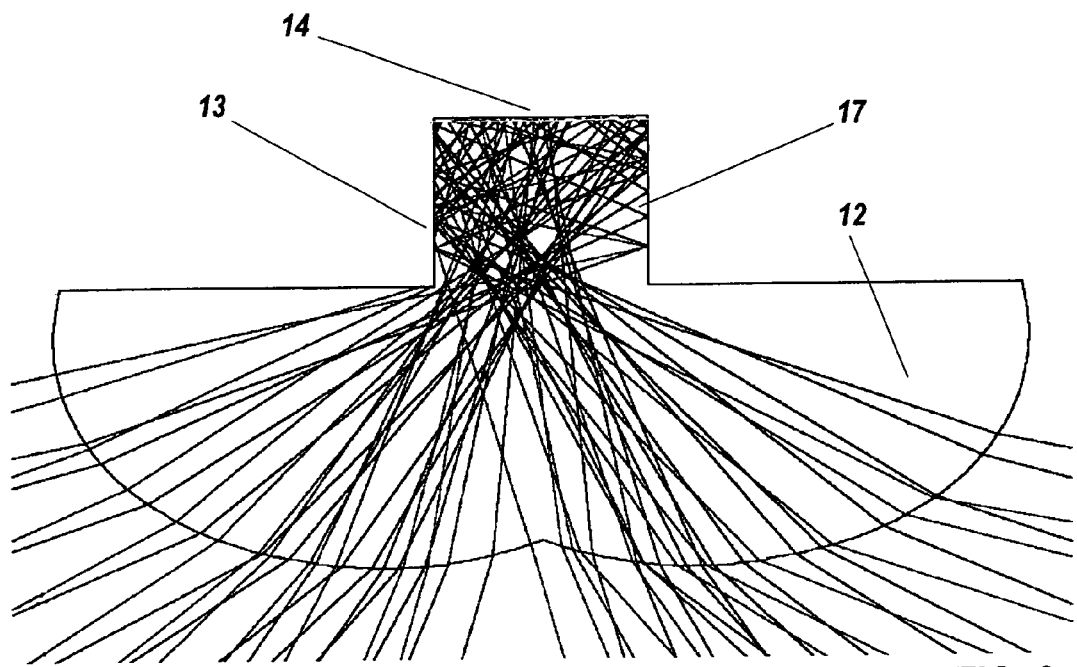
FIG. 2 is a close-up view of a secondary lens forming part of the concentrator.
Figure 1:
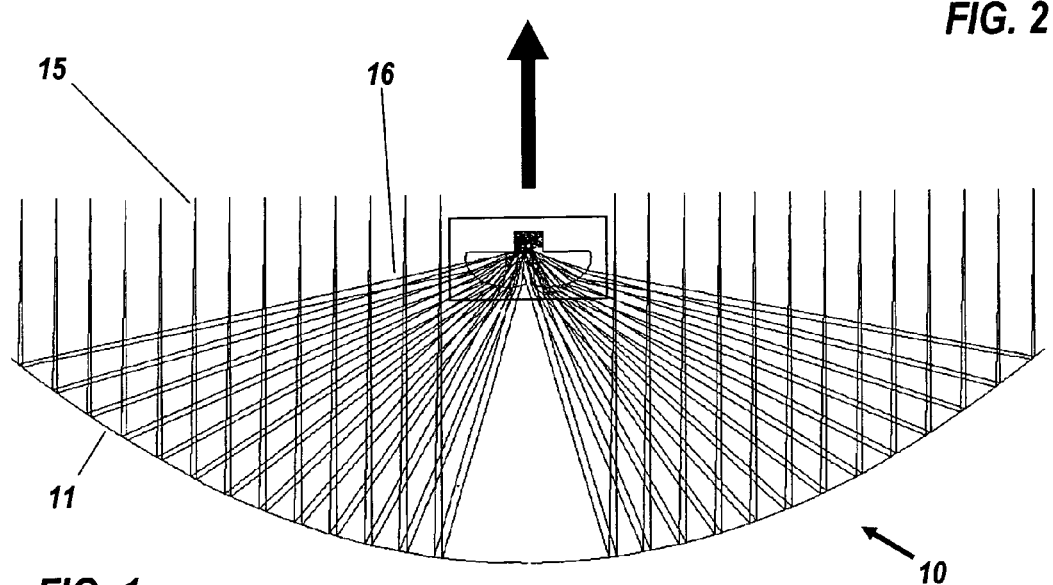
FIG. 1 is a cross sectional view of an embodiment of a solar concentrator showing the profiles of primary mirror and secondary lens and direct solar rays.

FIGS. 1 and 2 show an embodiment of a solar concentrator 10, comprising primary mirror 11, aspheric secondary lens 12, contrast-reduction rod 13, and photovoltaic cell 14 adhered to its end with a transparent coupling material. The sides of rod 13 are mirror coated. Direct solar rays 15 are shown as both on-axis and 1.5 deg rays, redirected as focused rays 16. Lens 12 redirects rays 16 into trapped rays 17 within rod 13, thereby reducing peak concentration on cell 14. Sufficient contrast reduction is possible in such a short length because of the wide illumination angle of the secondary lens by the primary mirror. A wide angle is desirable because it makes the entire device maximally compact. The rod's short length (about one cell diameter or less) is innovative over the prior art of concentrating photovoltaics, where long homogenizing rods can be found.

For practical solar applications, the transparent coupling material should be stable under ultraviolet light and temperature variations, so silicone elastomers or gels are presently preferred. Most of the widely used silicones, such as Dow Corning SYLGARD 182 and 184 or GE RTV615, have refractive indices in the range n=1.40-1.42. Higher index phenyl-modified silicones such as Dow Corning OE-6550 and JCR6175, show n=1.52-1.54. The higher index silicones are usually preferred, because by increasing the refractive index of the silicone three aspects are improved: the concentrator angular tolerance for a given concentration ratio can be increased, the reflectivity at the AR coated cell-silicone interface can be lower at high incidence angles, and the Fresnel reflection at the glass-silicon interface can be decreased.

Modern triple junction photovoltaic cells, particularly those of the SpectroLab Corporation of Sylmar, Calif., can tolerate an average irradiation of about 1000 suns, and a local maximum of no more than 1500 suns. Without the rod, some embodiments of the present invention would produce a peak solar concentration nearly 10 times the average or more, requiring derating to an average of no more than 150 suns, or one sixth of what the cell is capable of handling. Such derating is economically very unattractive.

Another innovative aspect of the present invention is that the short contrast-reduction rod can be manufactured along with the secondary lens as a single piece (by glass molding). This lowers their cost because separate elements would need an additional assembly step, and an unnecessary optical interface that reduces efficiency. The top, magnified view in FIG. 2 shows secondary lens 12 with rear surface comprising contrast-reduction rod 13.

Figure 3:
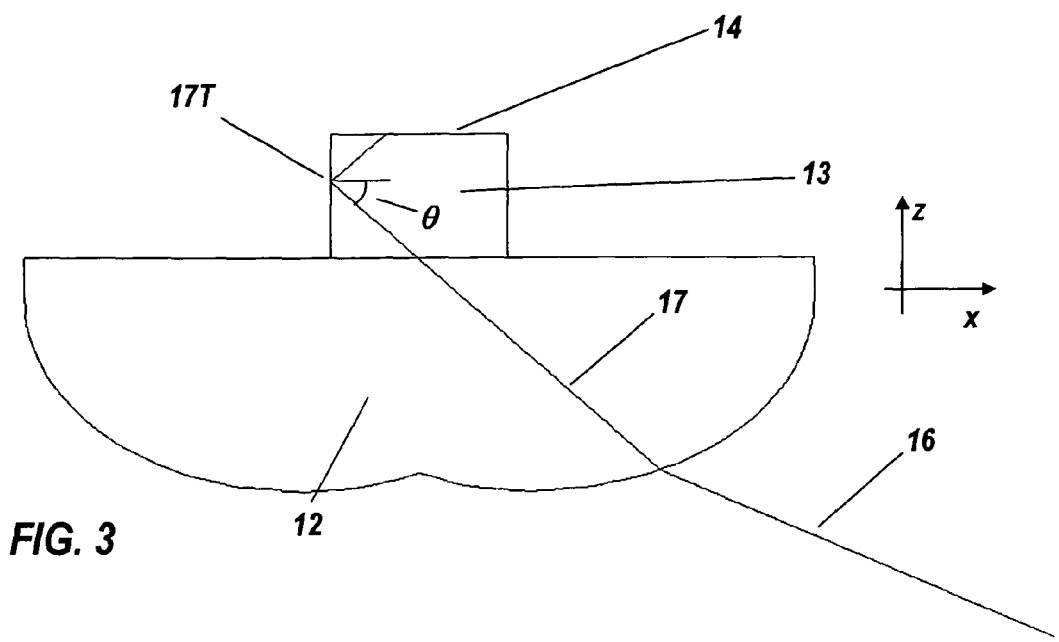
FIG. 3 is a cross-sectional view of the secondary lens shown in FIGS. 1 and 2, showing a contrast-reduction rod using total internal reflection (TIR).

While rod 13 was described as having a reflective coating in FIG. 1a, rod 13 can alternatively operate without coating, solely by Total Internal Reflection (TIR). As shown in FIG. 3, TIR at point 17T is obtained for any ray 17 beyond the material's critical angle $\theta_c=\sin^{-1}(1/n)$ (where n is the refractive index of the secondary lens), which limits how close to the surface normal the interior rays can hit the rod's sides and not escape. For a parallel sided rod 13, when the angle of incidence $\theta$ of a ray 17 on the side of the rod is $\theta=\theta_c$, then the angle $\beta$ of the ray to the principal axis is $\beta=90°-\theta_c$. The rim angle $\gamma$, which is the maximum angle to the principal axis of a ray between the mirror 11 and the lens 12, is determined by refraction at the surface of lens 12.

Because this embodiment may be used in arrays, its rotationally symmetric surface is preferably truncated as a square or a hexagon, which tile the plane. This fact can be advantageously exploited to avoid having to coat the rod if the truncated mirror surface is properly matched with the contrast reducing rod. Consider the concentrator shown in FIG. 3, in the case where the rotational mirror has been truncated within a square of side $L_i$, the rod has a squared entry aperture of side $L_o$, and the sides of the squared-off mirror are parallel to those of the squared-off aperture. To a good approximation, a sun ray that hits the primary mirror on coordinates (x,y) and foiling a small angle with the z axis within the design acceptance angle ax will reach the rod entrance plane with an approximate direction unit vector $$v=(p,q,+(1-p^2-q^2)^{1/2})$$

where:
p=x/f,
q=y/f,
f=$nL_o$/sin($\alpha$).

This x-y to p-q mapping is the Abbe sine condition applied to this geometry, which is approximately fulfilled by these designs as proven in (Winston, Miñano, Benitez, Nonimaging Optics, Elsevier 2004, pg 227).

The rays shown in FIG. 3 are located in the coordinate plane y=0 (in which also q=0, so p=sin (β)). The TIR at point 17T is obtained for ray 17 when θ>$θ_c$ or equivalently, p<cos ($θ_c$)=$(1-1/n^2)^{1/2}$. Note that by the mapping mentioned before,
$L_i \sin(α) = nL_o \cos(θ_c)$.
which is just the well-known etendue conservation equation in two dimensions.

Considering now rays in three dimensions, the combination of the TIR condition on the four facets of the square rod leads to the following four conditions over the coordinates of unit vector v=(p, q, +$(1-p^2-q^2)^{1/2}$):
|p|<cos($θ_c$) and |q|<cos($θ_c$) for both positive and negative limits of p and q.

Figure 4:
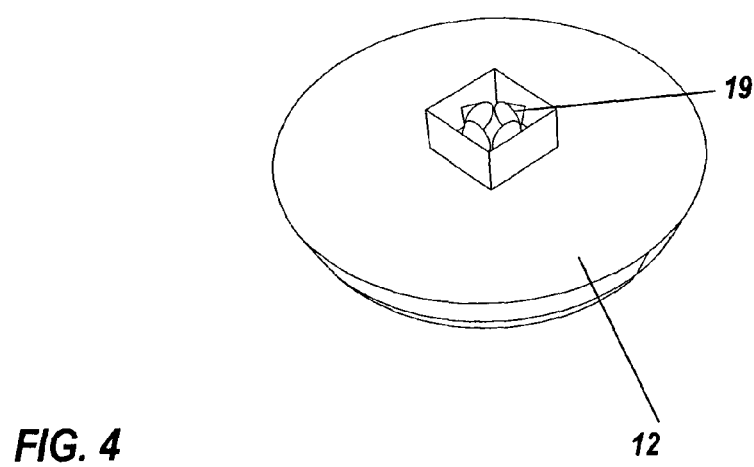
FIG. 4 is a perspective view of the secondary lens shown in FIGS. 1 and 2, showing TIR ray cones within a square contrast-reduction rod in three dimensions.

This set of conditions is fulfilled by the rays propagating outside the cones 19 shown inside the rod of FIG. 4. Note these conditions are fulfilled by certain rays entering the rod forming up to 90° with the z-axis, since that angle is given by $\sin^{-1}(p^2+q^2)$ and thus, for instance, for |p|=|q| that angle is not limited by the TIR inequalities for n>$\sqrt{2}$, since 2 $\cos^2(θ_c)$=2 $(1-1/n^2)$<1.

From the aforementioned x-y to p-q mapping, we deduce that the portion of the mirror from which the rays are traced back to the aperture has the coordinates |x|<$L_i$ and |y|<$L_i$, which exactly matches the square truncation of the mirror done parallel to the rod sides. A square rod is interesting from a practical point of view because it matches the usual square shape of photovoltaic cells manufactured by dicing a larger wafer.

Similar matching considerations can be easily applied by a person skilled in the art for hexagonal truncation of the aperture and a hexagonal rod, with the sides of the hexagonal rod parallel to the sides of a hexagonally truncated primary mirror. Though solar cells are not easily cut in hexagons at present (but may be by laser cutting in a near future), such a hexagonal active area of the solar cell, inscribed inside a conventional square or rectangular dicing cell area, allows for inactive corner areas which can be useful for the cell interconnection, especially when the solar cells are small (in the few square millimeter range) and cell electrical connection requires a minimum area.

Figure 5:
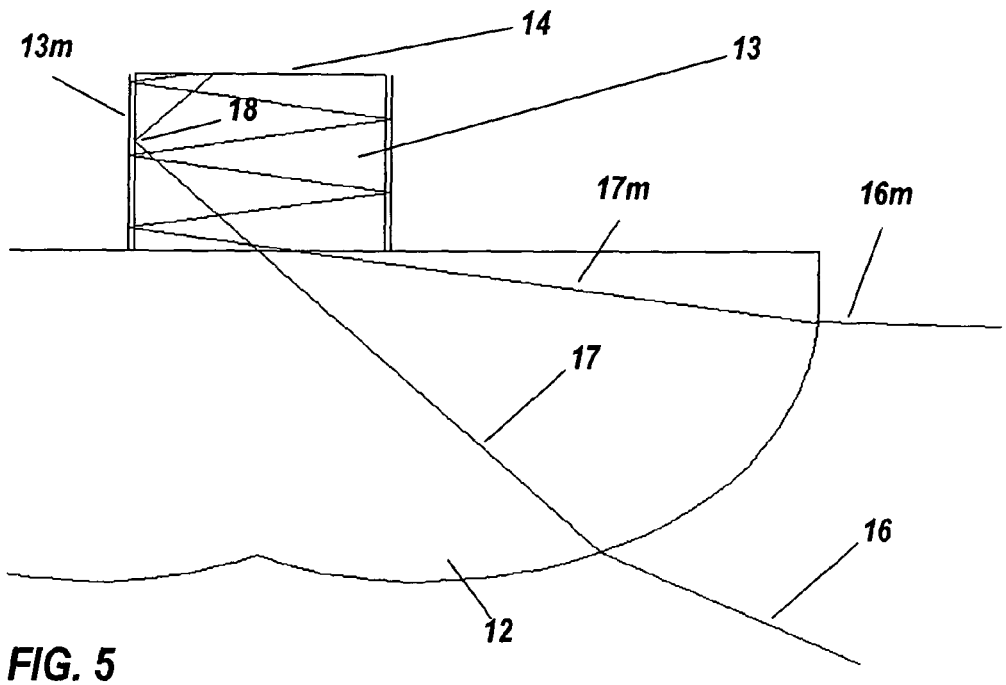
FIG. 5 is a lateral view of the secondary lens shown in FIGS. 1 and 2, showing the TIR operation of the rod and a mirror separated from the rod by a low-index gap.

If matched aperture truncation is not desired and the TIR condition cannot be fulfilled, FIG. 5 shows auxiliary tubular mirror 13m disposed closely around rod 13, but with a low-index gap (maybe air) in between. This way efficiency is superior to the all-coated rod because most of the light undergoes highly efficient TIR and the minority that fails the TIR condition on the rod's sidewalls is reflected by the mirror and re-captured by the rod.

Figure 6:
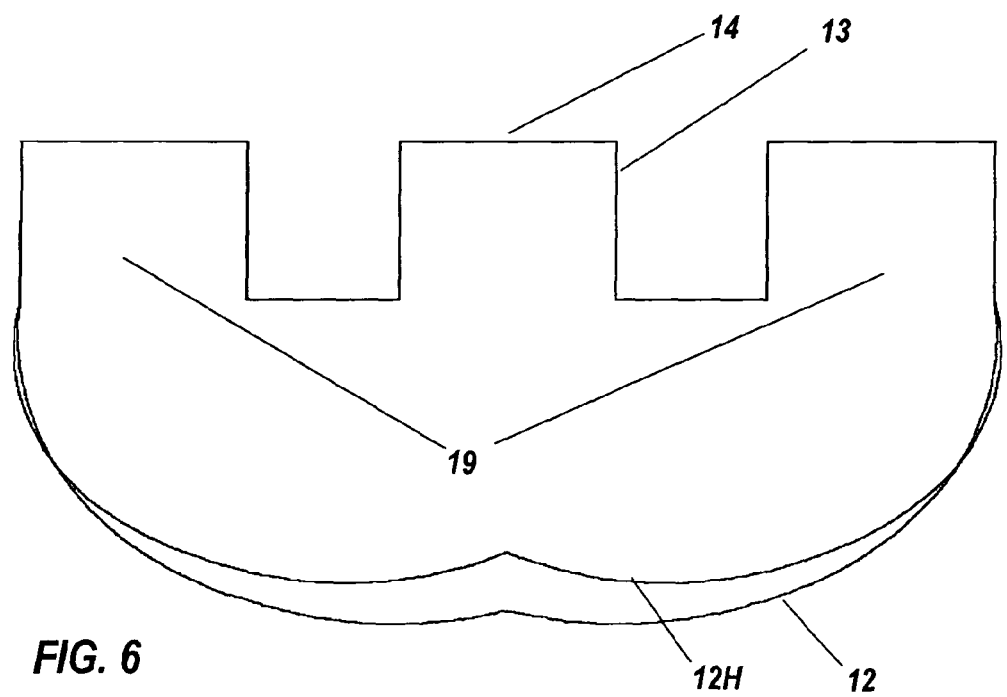
FIG. 6 shows the profile of an alternative form of the secondary lens with structural protection features molded on its rear, as well as a comparison profile for a higher refractive index.

Alternatively, high index glasses can be used. Secondary lens 12 as shown in FIGS. 1 to 5 was designed for the refractive index 1.52 of BK7 glass, an ultra-clear 'white' variety. This higher index advantageously increases the acceptance of rod 13. Glass with refractive index 1.83 at 700 nm and 1.90 at 400 nm has recently become available from the Ohara Corporation of Japan. Ohara PBH56 is such a material exhibiting high transmission, with low photoelastic constant. This glass has high transmittance from 400 nm to 2000 nm (over 96% at 400 nm and 99% by 420 nm in a 10 mm length). For comparison purposes, lower profile 12H is shown in FIG. 6 for refractive index 1.83. This higher index advantageously increases the acceptance of rod 13.

The rod can be tapered to produce additional concentration of the light. A person skilled in the art can easily deduce from the preceding explanation of the straight rod case that the taper angle rotates the cones of TIR condition by exactly the taper half-angle, reducing the acceptance solid angle of the rod, provided the rod is short enough that no TIR reflected ray will meet the opposite side wall before reaching the exit end.

Protection of the rod from the environment (water, dust, etc.) could be provided by extra features at the rear of the lens, as shown in FIG. 6, where outer ridge 19 shelters rod 13 and cell 14, on the rear of secondary lens 12.

The tracking tolerance of the present invention is measured by its optical acceptance angle:

| Geometric Concentration | 800× | 1000× | 2000× |
|---|---|---|---|
| Square Mirror (for 1-cm cell) | 28 cm | 32 cm | 45 cm |
| Acceptance Angle | ±1.95° | ±1.75° | ±1.30° |

Figure 7:
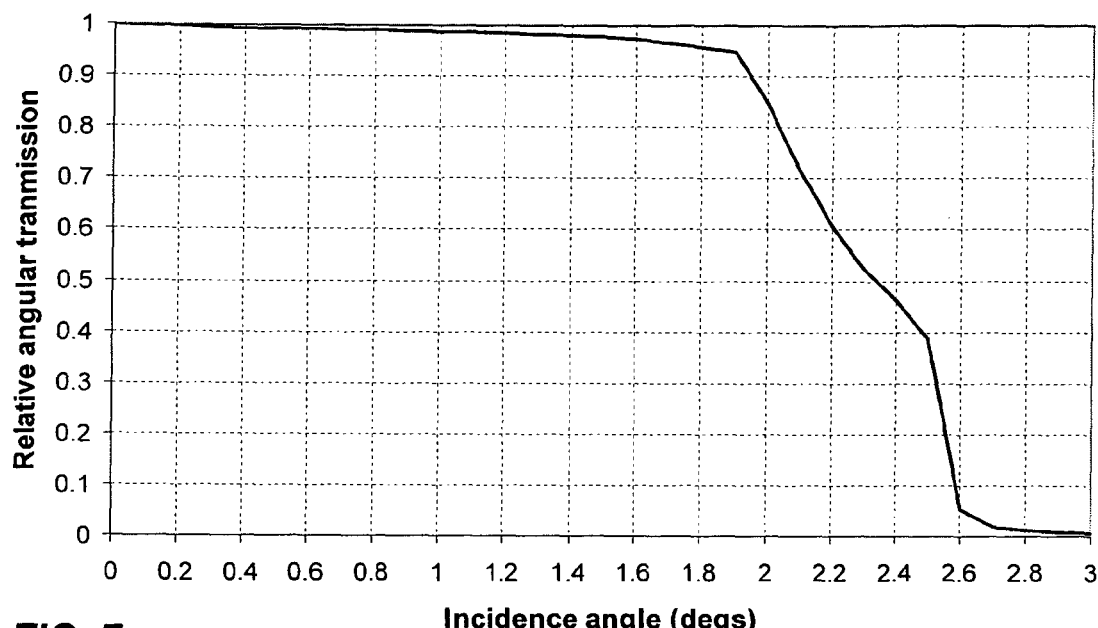
FIG. 7 is a graph showing the off-axis acceptance of the concentrator shown in FIGS. 1 and 2.

FIG. 7 shows the performance of the concentrator with a graph of transmission efficiency acceptance versus off-axis incidence-angle.

Figure 8:
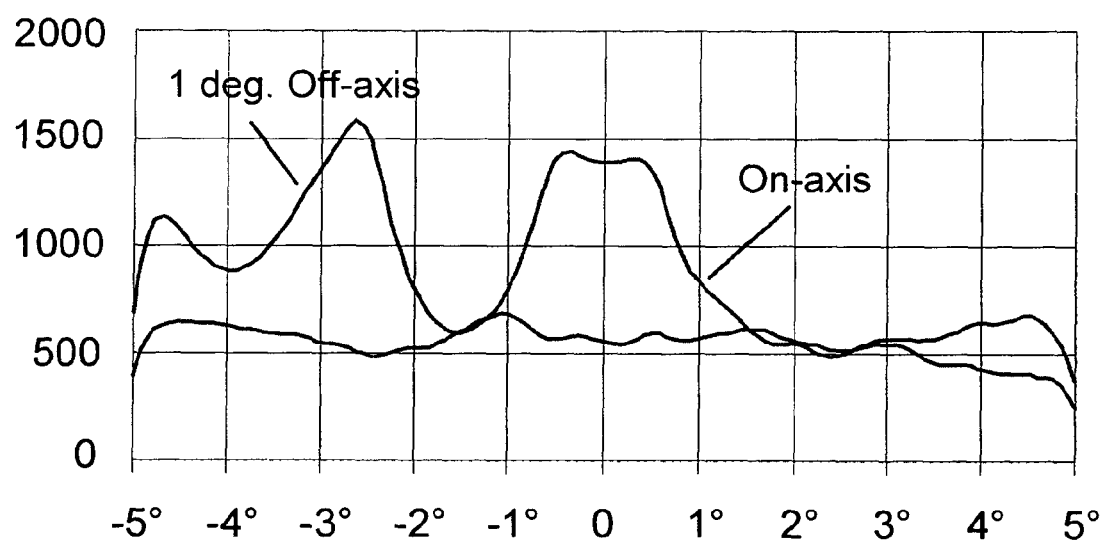
FIG. 8 is a graph showing the flux on the photovoltaic cell for on-axis and off-axis irradiation.

FIG. 8 shows the performance of the contrast-reduction rod, on-axis and 1 degree off-axis. In both cases the cell is limited to 1500 suns maximum, explicitly by ray-tracing a series of progressively longer rods, until a rod length is found at which this limit is not reached. This turned out to be a rod-length only ¾ of the width of cell 14, although greater lengths up to the cell width may be desirable in some embodiments.

Figure 9:
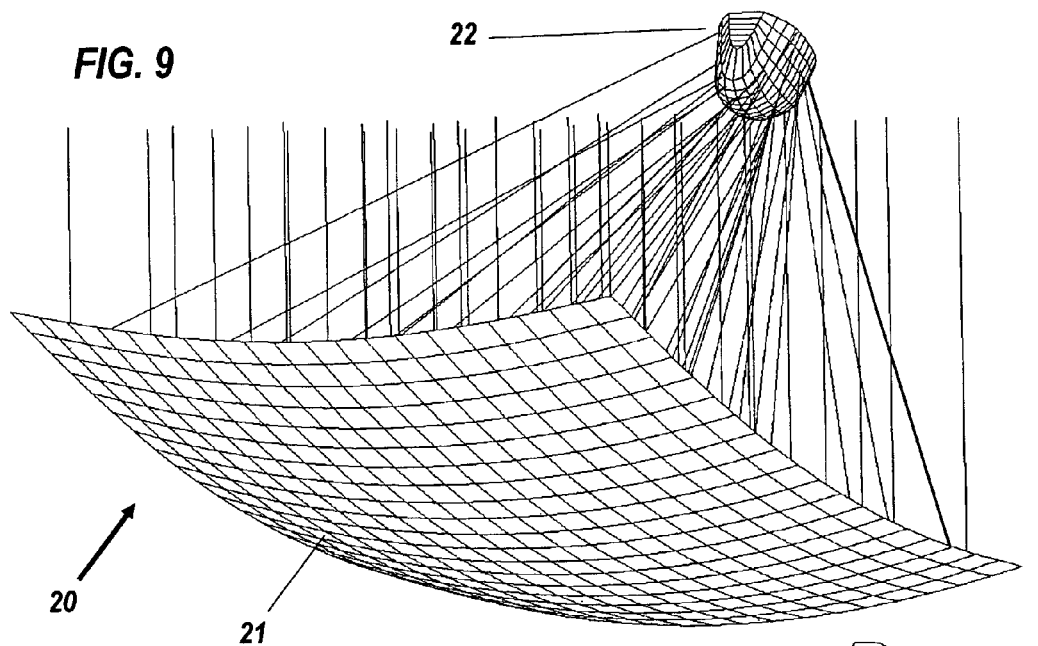
FIG. 9 is a perspective view of a free-form rectangular primary mirror and a free-form secondary lens forming part of another embodiment of a solar concentrator.
Figure 10:
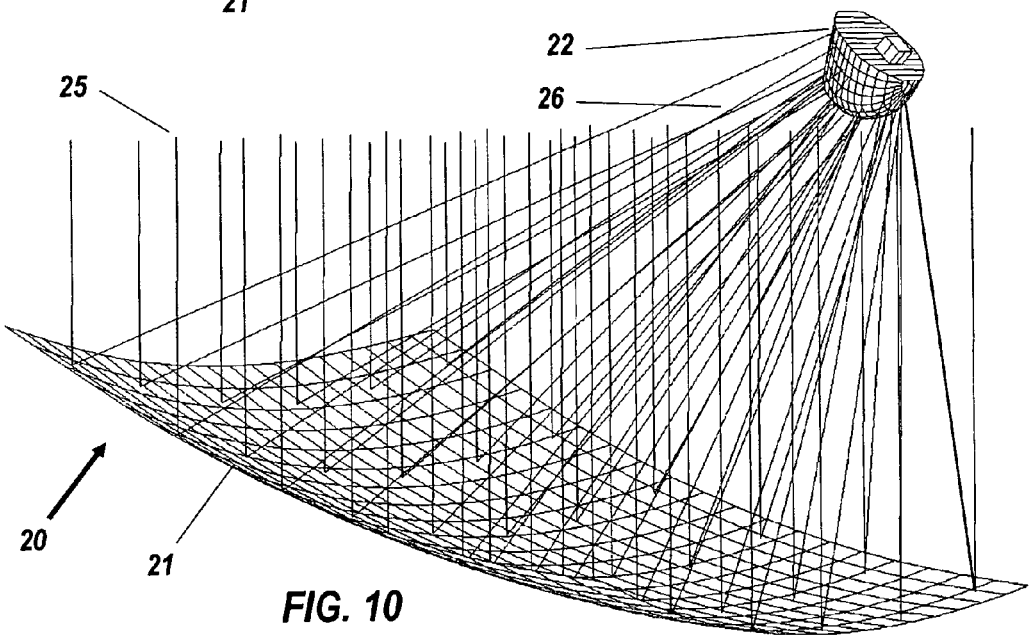
FIG. 10 is a further perspective view of the lens and mirror shown in FIG. 9.
Figure 11A:
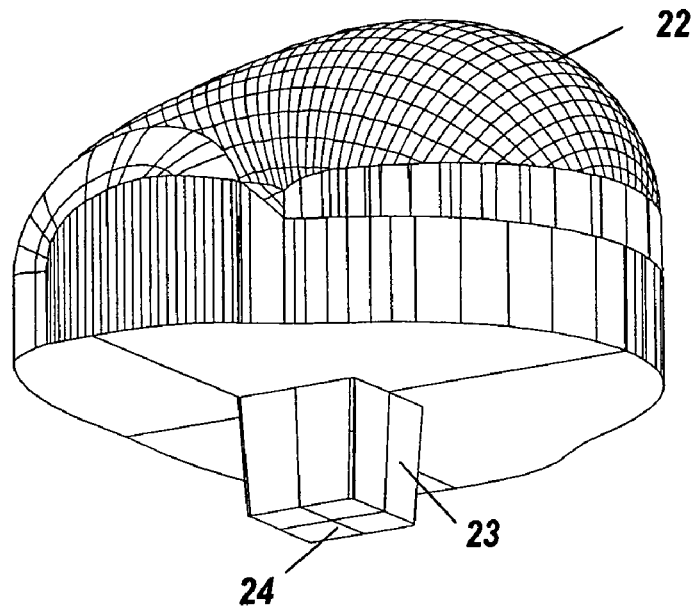
FIGS. 11A to 11C are close-up views from different perspectives of the free-form secondary lens shown in FIG. 9.
Figure 11B:
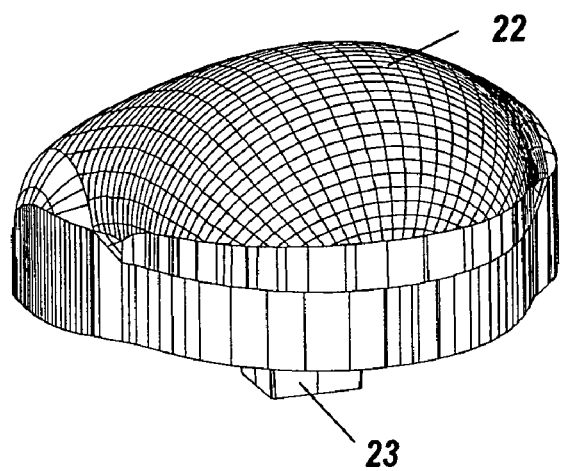
Figure 11C:
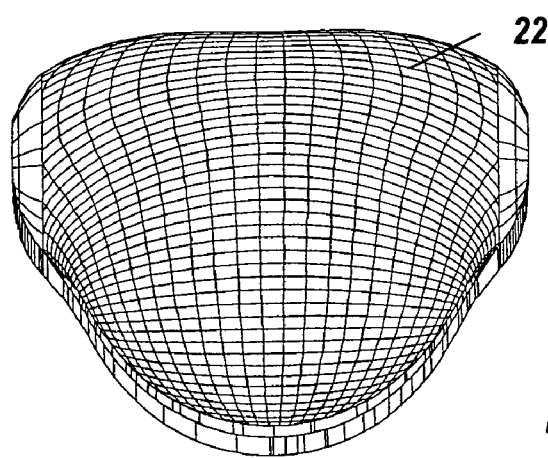

Referring now to FIG. 9 and FIG. 10, a further embodiment of solar collector is a free-form concentrator 20, comprising a rectangular free-form mirror 21 and a free-form secondary lens 22. FIGS. 11A, 11B, and 11C are different perspective views of secondary lens 22 to a larger scale, also showing the contrast-reduction rod 23 with solar cell 24 adhered to its end, best seen in FIG. 11A. The lateral surfaces of rod 23 are mirror coated. Primary mirror 21 reflects direct solar rays 25 into focused rays 26, which are received by secondary lens 22.

Figure 12:
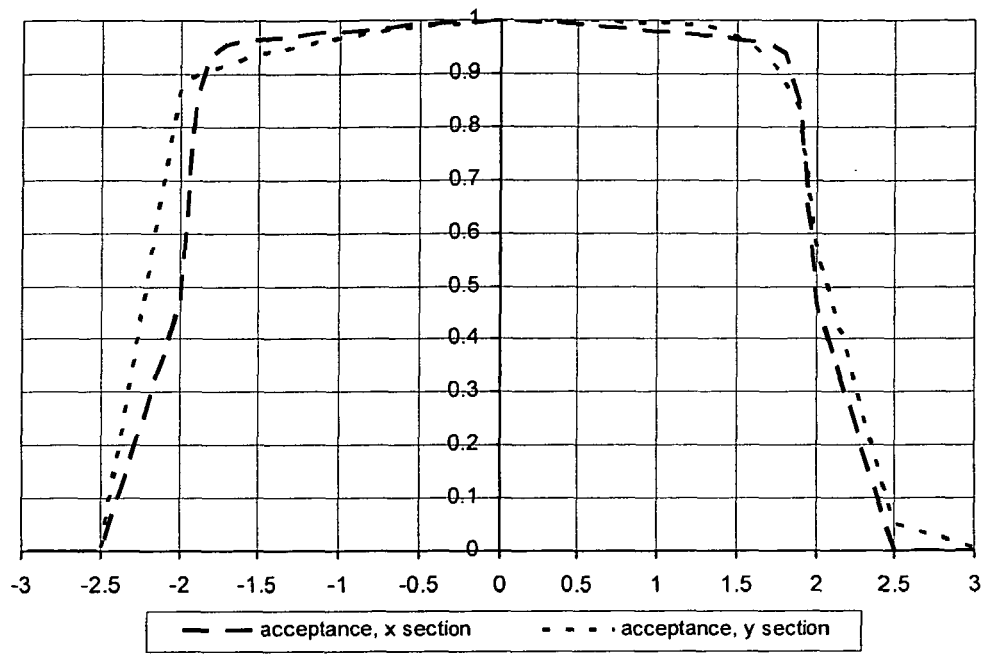
FIG. 12 is a graph showing the acceptance angle of the free-form system shown in FIG. 9 in perpendicular planes.

FIG. 12 is a graph of acceptance of the free-form system as a function of deviations in two perpendicular directions. Both curves represent considerable superiority over the prior art.

The concentrator of FIG. 9 can be deployed several ways into arrays. Rows of concentrators can be tilted vertically to follow the sun. Several rows can be placed on a circular platform, which turns to track solar azimuth. Circular platforms can be close packed so that the dishes intercept ⅔ of all the land's sunlight. These platforms can have such a low profile that the wind loads will be minimal and roof top applications will be practical.

Figure 20:
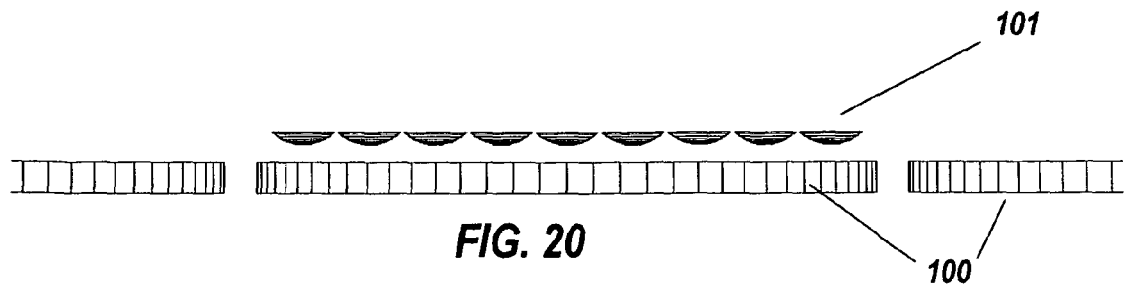
FIG. 20 is a side view of a low-profile deployment of arrays of an embodiment of a solar concentrator according to the present invention.
Figure 21:
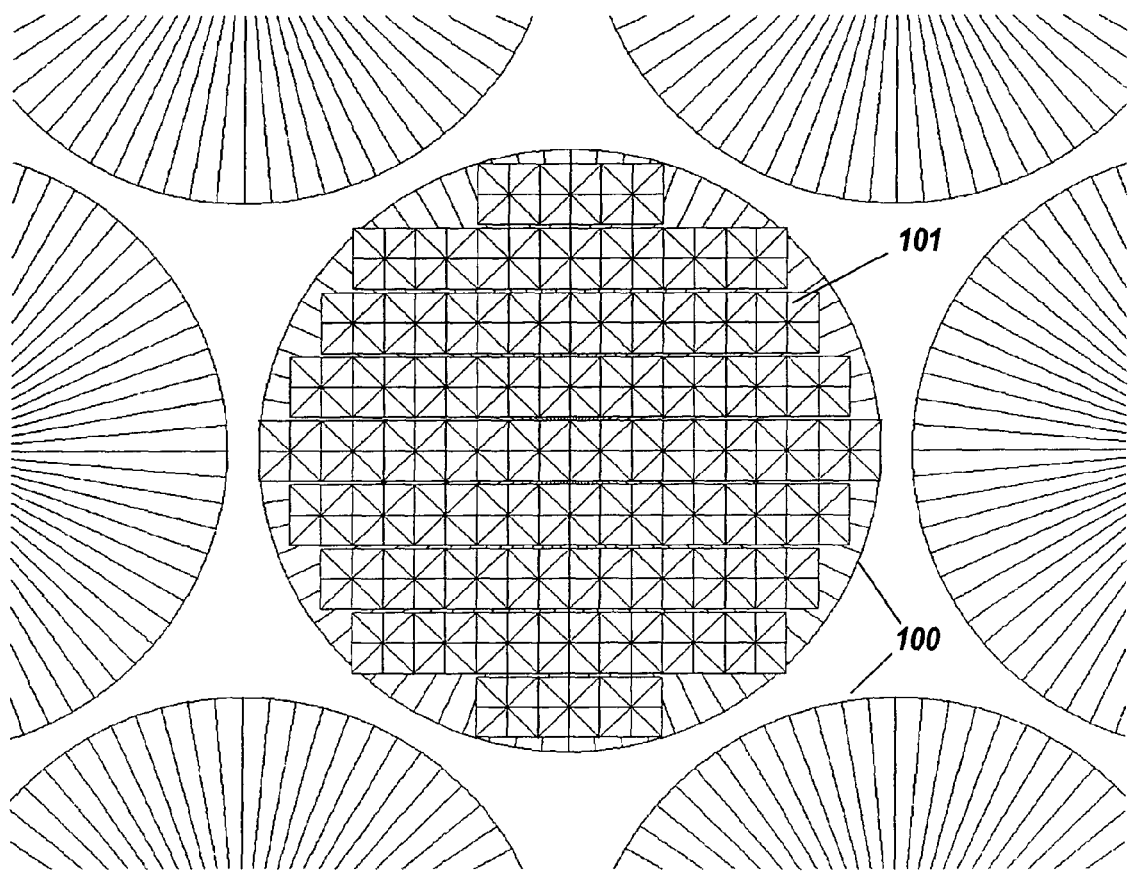
FIG. 21 is a top view of the arrays shown in FIG. 20.

FIG. 20 is a side view showing platforms 100, with rows 101 of dishes, in a horizontal position representing night-time stowing. FIG. 21 is a top view of same, showing the hexagonal close packing of the circular platforms. For clarity only one platform 100 is shown in detail with its full complement of 64 dishes 101. Actual installations would more likely have a hundred such dishes on each platform 100.

Figure 22:
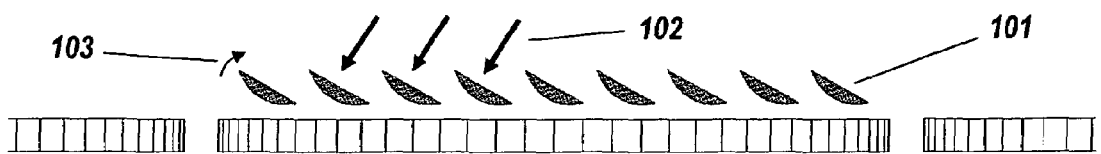
FIG. 22 is a view similar to FIG. 20 showing the solar concentrators in an elevated attitude.

FIG. 22 is a side view similar to FIG. 20, but with dishes 101 tilted in elevation tracking direction 103 towards direct sunlight 102, represented by arrows in the direction of incoming rays.

Figure 23:
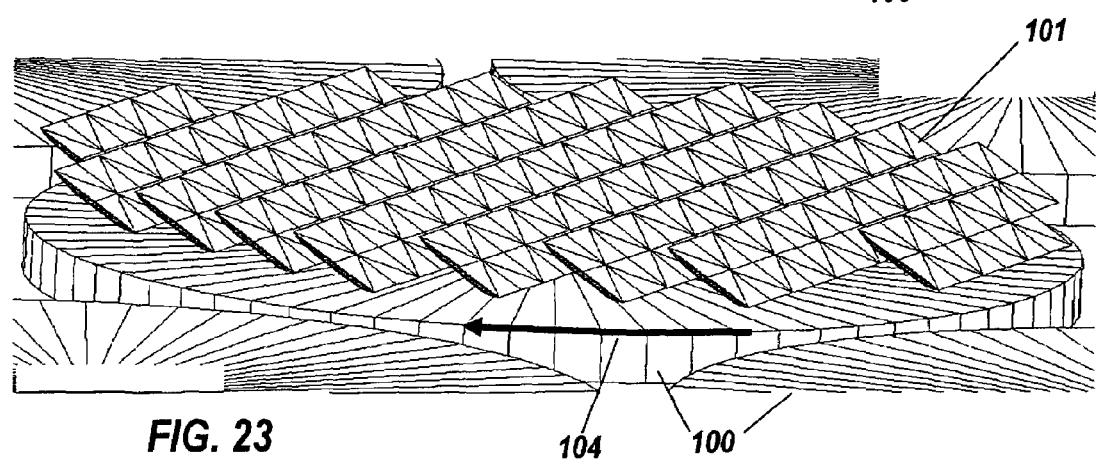
FIG. 23 is a perspective view of the arrays as seen in FIG. 22.

FIG. 23 is a perspective view of platform 100 of FIG. 21 with the dishes 101 tilted as in FIG. 22, also showing azimuth tracking direction 104.

Figure 24:
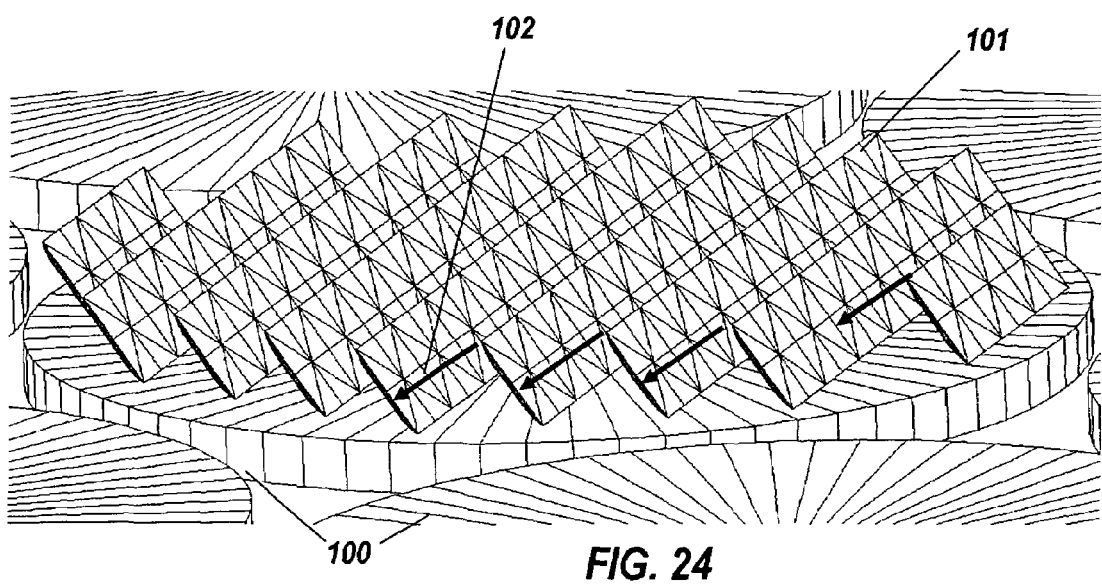
FIG. 24 is a perspective view similar to FIG. 23, showing the arrays at a higher elevation.

FIG. 24 is a perspective view of platform 100, similar to FIG. 23 but with dishes 101 aimed for a lower sun angle. Solar rays 102 are placed to show how each row of dishes 101 is partially shaded by the dishes of the row in front of it, reducing output from what each row would have unshaded. While this array-method is far more land thrifty than the conventional widely separated tracking platforms, its annual capacity factor (relative to what could be achieved with no shading) is reduced in comparison, by up to about 75%, depending upon latitude. In fact, this close-packed array system would only be used at lower latitudes (less than 40 degrees), such as in the desert Southwest of the U.S.A.

The mirror-lens combination can be designed using different design methods, for instance:
As described in U.S. Pat. No. 6,639,733,
For the free-form case, as described in U.S. Patent Application 2005/008603)
As described in J. C. Miñano, J. C. Gonzalez, "New method of design of nonimaging concentrators", Appl. Opt. 31, pp. 3051-3060, (1992)
As an aplanatic two-surface system free from circular coma of all orders (as introduced by Schwarzschild in 1905 for 2 mirror designs, see Born & Wolf, *Principles of Optics*, p. 168).

The Schwarzschild aplanatic design requires that the stigmatic condition (i.e., parallel on-axis input rays are focused onto a single output point) and the Abbe sine condition (i.e., $r=f*\sin(\beta)$), where f is the focal length, r is the distance of an on-axis input ray to the optical axis and $\beta$ is the angle subtended by the corresponding output ray with the axial axis) are met.

As an example, the following mathematical method may be used to calculate the rotationally symmetric concentrator, from the edge to the axis.

Step 1. Selecting the design parameters, shown in FIG. 13: the secondary lens refraction index, n;
the initial point on the mirror, $X_o=(x_o, z_o)$, which defines the rim angle, $\gamma$;
the initial point on the lens, $S_o$, which defines the illumination angle, $\beta$; and
the rod input aperture length, which is segment PQ.

The design acceptance angle is determined by the étendue conservation law, so $\alpha = \arcsin(2nx_o \sin(\beta)/|PQ|)$.

Figure 13:
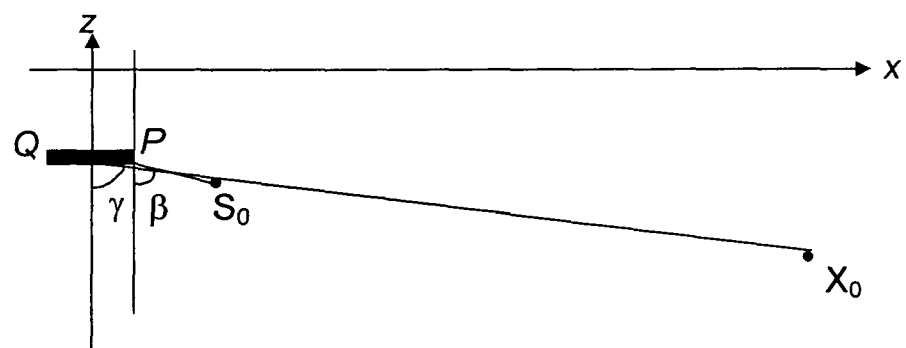
FIGS. 13 through 17 are diagrams illustrating the mathematical steps of an SMS algorithm generating embodiments of the present invention.

The initial point on the lens, $S_0$, as shown in FIG. 13, is such that the ray from initial point $S_0$ to the nearer edge P of the receiver is at the angle $\beta$ to the central axis (z axis) of the optical system.

Figure 14:
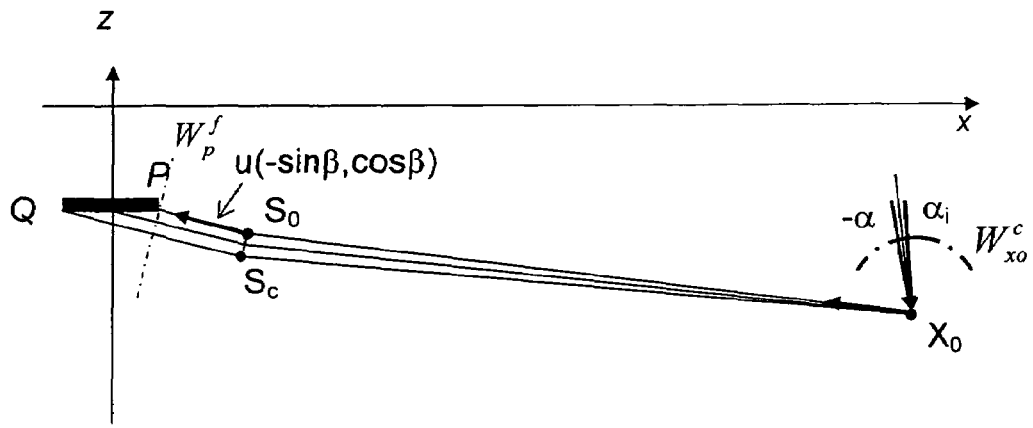

Step 2. The initial Cartesian Oval, shown in FIG. 14.

Various initial Cartesian Ovals can be calculated. In this example, a Cartesian Oval is selected for the solar concentrator depicted in FIG. 1. The oval comprises two sections where its first point is the lens's initial point $S_0$ and the point between the two sections is $S_c$. The following detailed procedure calculates the two sections of the initial Cartesian Oval.

Step 2.1. The first section couples the flat wavefront $W_p^f$ that passes through the near edge P of the receiver and represents rays that will pass between the receiver's edges P and Q in the direction defined by the vector u ($-\sin \beta, \cos \beta$)) and the circular-wavefront $W_{oo}^c$ with center in $X_0$, angularly limited by the source edge rays $-\alpha$ and $\alpha_i$ at point $X_0$ of the aperture. ($\alpha_i$ and the endpoint $S_c$ of this step are determined by starting at $X_0-S_0=P$ and moving sideways until you reach Q.) The optical path length for the oval calculation is $$C_1 = d(S_0, W_p^f)*\eta + d(S_o, X_0) + d(X_o, W_{xo}^c),$$

where:
$d(S_0, W_p^f)*n$ is the optical path length between the lens's initial point and the wavefront $W_p^f$;
$d(X_0, W_{xo}^c)$ is the optical path length between the mirror's initial point and the wavefront $W_{xo}^c$; and
$d(S_o, X_0)$ is the optical path length between the points $S_0$ and $X_0$.

The absolute position of $W_{xo}^c$ and $W_p^f$ is not defined, but that does not affect the calculation, because all the rays traced are perpendicular to the two wavefronts.

For the calculation we trace rays from the wavefront $W_{xo}^c$ between the edge rays $-\alpha$ and $\alpha_i$, deflect them in the point $X_0$, and finally calculate the new points on the lens from $S_0$ to $S_c$ so that the path length from the wavefront $W_{xo}^c$ to the wavefront $W_p^f$ is constant and equal to $C_1$.

Figure 15:
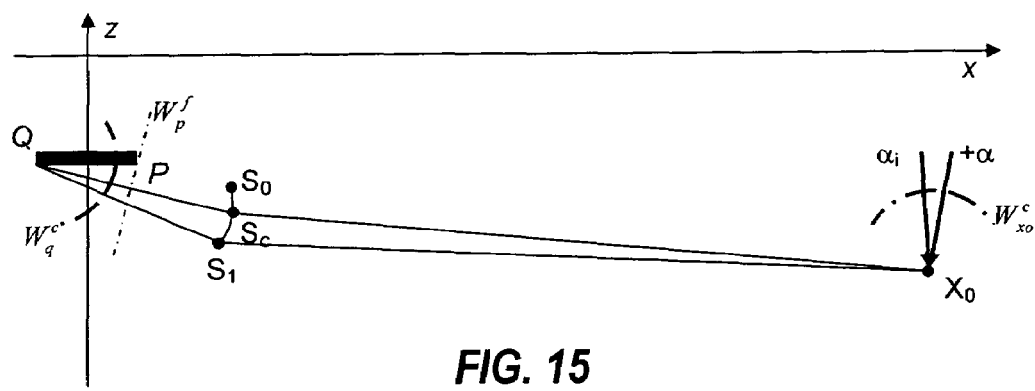

Step 2.2. As shown in FIG. 15, the second section couples two circular wavefronts: the one centered on the point Q defining the far edge of the receiver and the wavefront $W_{xo}^c$ angularly limited by the source edge rays as and $\alpha_i$ and $+\alpha$ at $X_0$. The optical path length for the oval calculation is $$C_2 = d(S_c, W_q^c)*\eta + d(S_c, X_o) + d(X_o, W_{xo}^c),$$

where:
$S_c$ is the last calculated point of the previous section of the oval (Note that the rays from $W_p^f$ and $W_q^c$ that pass through the point $S_c$ have the same direction.);
$d(S_c, W_q^c)*\eta$ is the optical path length between $S_c$ and the wave front $W_q^c$;
$d(X_0, W_{xo}^c)$ is the optical path length between $X_0$ and the wavefront $W_{xo}^c$; and
$d(S_c, X_0)$ is the optical distance between the points $S_c$ and $X_0$.

For the calculation we trace rays from the wavefront $W_{xo}^c$ between the edge rays $\alpha_i$ and $+\alpha$, deflect them in the point $X_0$, and finally calculate the new points of the lens from $S_c$ to $S_1$ such that the path length from the wavefront $W_{xo}^c$ to the wavefront $W_p^f$ is constant and equal to $C_2$.

At this point of the calculation we have a list of points, $S_n$, in the lens surface that will be used to generate points of the mirror surface.

Figure 16:
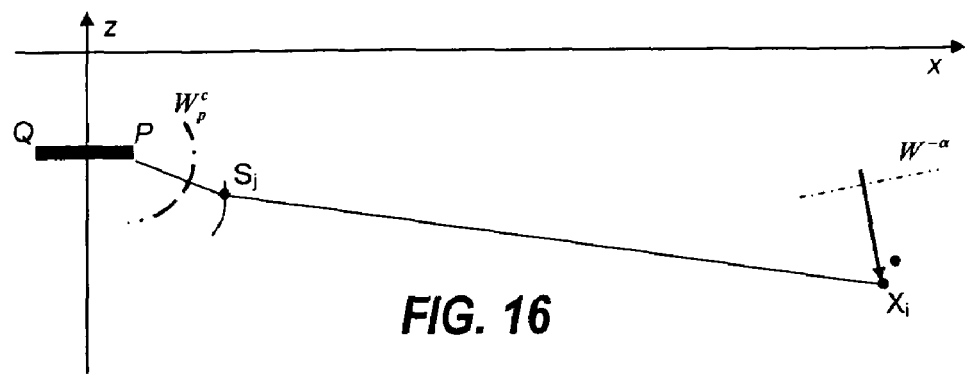
Figure 17:
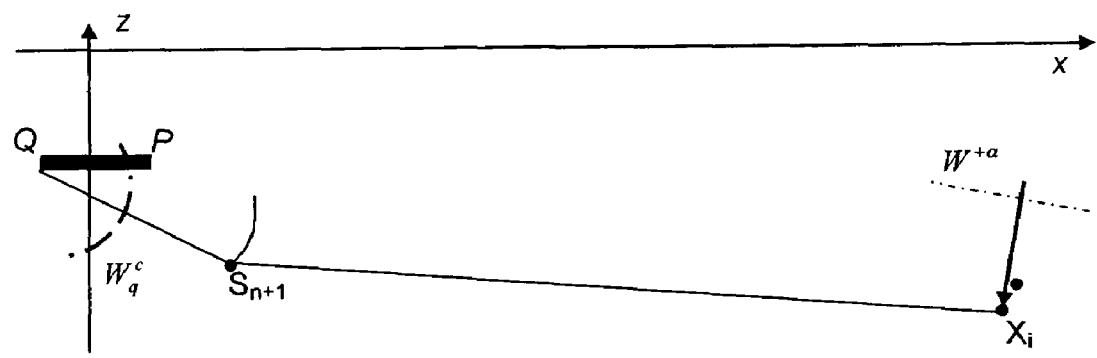

Step 3. Calculating the SMS points, as shown in FIGS. 16 and 17.

For the calculation of the mirror points and the new points of the lens we will use the SMS method which is now described. The method mainly comprises tracing through calculated points in one surface in order to calculate new points in the other surface.

The optical path length $C_3$ used to calculate new points in the mirror is $$C_3 = d(S_0, W_p^c)*\eta + d(S_o, X_0) + d(X_o, W^{-\alpha}),$$

where:
$d(S_0, W_p^c)$ is the optical path length between $S_0$ and the circular wavefront $W_p^c$ centered in P; and
$d(X_o, W^{-\alpha})$ is the optical path length from the point $X_0$ to the flat wavefront $W^{-\alpha}$ defined by the source edge ray $-\alpha$.

Referring to FIG. 17, the optical path length $C_4$ used to calculate new points in the lens is $$C_4 = d(S_c, W_q^c)*\eta + d(S_c, X_0) + d(X_o, W^{+\alpha}),$$

where:
$d(X_o, W^{+\alpha})$, is the optical path length from the point $X_0$ to the flat wavefront $W^{+\alpha}$ defined by the source edge ray $+\alpha$.

The design procedure is as follows:
Step 3.1—Select a point $S_j$, from the list of calculated lens points $S_n$.
Step 3.2—Calculate the ray coming from the wavefront $W_p^c$ that passes through the selected point $S_j$, and deflect the ray in the lens surface at the point $S_j$.
Step 3.3—Calculate a new point $X_j$ in the mirror that makes the path length for the calculated ray through the point $S_j$ from the wavefront $W_p^c$ to the wavefront $W^{-\alpha}$ constant and equal to $C_3$.

Step 3.4—Calculate the ray coming from the wavefront $W^{+\alpha}$ that passes through the newly-calculated point $X_i$ and deflect the ray in the mirror surface at the point $X_i$.

Step 3.5—Calculate a new point $S_{n+1}$ in the lens that makes the path length for the ray calculated in Step 3.4 from the wavefront $W^{+\alpha}$ to the wavefront $W_q^c$ constant and equal to $C_4$.

Step 3.6—Repeat the process from step 3.1, and stop when the $S_j$ and $X_i$ points reach the central axis (z axis) of the optical system.

In order to use a more classical description of the calculated aspherics, the mirror profile can be approximated by a rotationally symmetric aspheric of the form:

$$z = \frac{cr^2}{1+\sqrt{1+(1+k)c^2r^2}} + \sum_i a_i r^{2i}$$

where c is the base curvature at the vertex, k is a conic constant, r is the radial coordinate measured perpendicularly from the optical axis, and $a_i r^{2i}$ are higher-order aspheric terms.

| Conic constant k | Surface type |
| --- | --- |
| k > 0 | Oblate ellipsoid |
| k = 0 | Sphere |
| −1 < k < 0 | Ellipsoid |
| k = −1 | Paraboloid |
| k < −1 | Hyperboloid |

Figure 18:
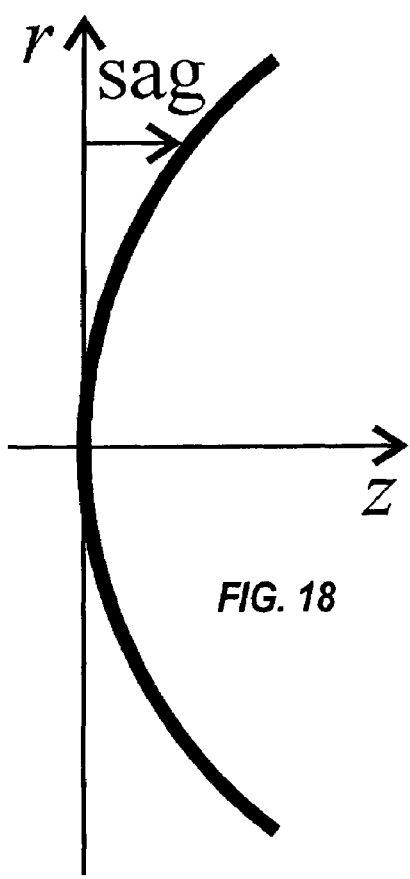
FIG. 18 is a diagram of the primary reflector of an embodiment of a solar concentrator.

The primary mirror profile designed with the above steps is shown in FIG. 18. It is well approximated by an asphere close to a parabola with c=0.0446734 and k=−1.03006 with 0≦r≦18.837.

Figure 19:
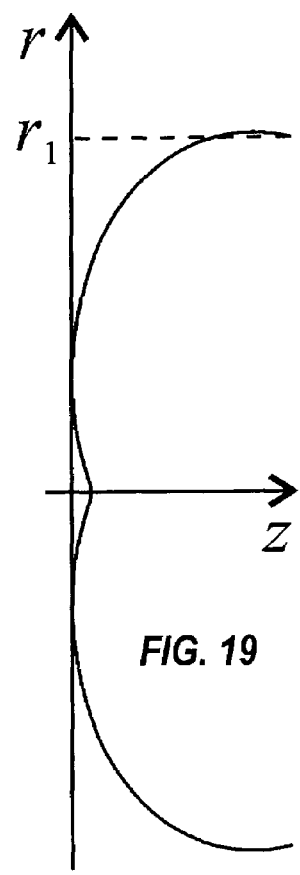
FIG. 19 is a diagram of the secondary lens of an embodiment of a solar concentrator.

The surface of the secondary lens of this example, shown in FIG. 19, cannot be described by the previously mentioned classical equation of an aspheric because of its indented center and because it curves inwards so that, for the larger values of r (such as $r_1$ in FIG. 19), there are two values of z. By changing the input parameters it is possible to obtain designs without an indented center and without such inward curving (which is desirable for easier manufacturing). Alternatively, two high order polynomials can be used to describe a profile such as is shown in FIG. 19 in parametric form, with parameter t (0≦t≦1). The first polynomial is:

$r = 0.0386962890625$
$+23.217849731445312$ $*t$
$-1526.8641357421875$ $*t^2$
$+80831.8466796875$ $*t^3$
$-2.792130640625$ $*10^6$ $*t^4$
$+6.542389518359375$ $*10^7$ $*t^5$
$-1.084122905046875$ $*10^9$ $*t^6$
$+1.3160106664382812$ $*10^{10}$ $*t^7-$
$-1.204862587034375$ $*10^{11}$ $*t^8$
$+8.522509923160742$ $*10^{11}$ $*t^9$
$-4.75090109396648$ $*10^{12}$ $*t^{10}$
$+2.1215776655508176$ $*10^{13}$ $*t^{11}$
$-7.691625871782634$ $*10^{13}$ $*t^{12}$
$+2.2885016102995184$ $*10^{14}$ $*t^{13}$
$-5.636417479696351$ $*10^{14}$ $*t^{14}$
$+1.1568686178032698$ $*10^{15}$ $*t^{15}$
$-1.988636632256891$ $*10^{15}$ $*t^{16}$
$+2.872677696664673$ $*10^{15}$ $*t^{17}$
$-3.49367783531877$ $*10^{15}$ $*t^{18}$
$+3.578308105285642$ $*10^{15}$ $*t^{19}$
$-3.08243998154808$ $*10^{15}$ $*t^{20}$
$+2.2261676554326428$ $*10^{15}$ $*t^{21}$
$-1.340733428491104$ $*10^{15}$ $*t^{22}$
$+6.679280026445929$ $*10^{14}$ $*t^{23}$
$-2.7202722429461834$ $*10^{14}$ $*t^{24}$
$+8.905101473751042$ $*10^{13}$ $*t^{25}$
$-2.2859161102896887$ $*10^{13}$ $*t^{26}$
$+4.431240175129141$ $*10^{12}$ $*t^{27}$
$-6.099333692924224$ $*10^{11}$ $*t^{28}$
$+5.313285922844664$ $*10^{10}$ $*t^{29}$
$-2.202553314220716$ $*10^9$ $*t^{30}$

And the second polynomial is $z = 1.3821332454681396$
$-7.337404251098633$ $*t$
$+414.45654296875$ $*t^2$
$-15619.450378417969$ $*t^3$
$+358359.8916015625$ $*t^4$
$-5.079436850341797$ $*10^6$ $*t^5$
$+4.288841013574219$ $*10^7$ $*t^6$
$-1.5045174170410156$ $*10^8$ $*t^7$
$-1.1186001149042969$ $*10^9$ $*t^8$
$+2.097234930204883$ $*10^{10}$ $*t^9$
$-1.712063800080542$ $*10^{11}$ $*t^{10}$
$+9.471902654740923$ $*10^{11}$ $*t^{11}$
$-3.93813590844632$ $*10^{12}$ $*t^{12}$
$+1.2871548528984807$ $*10^{13}$ $*t^{13}$
$-3.3912049557473355$ $*10^{13}$ $*t^{14}$
$+7.316514846821811$ $*10^{13}$ $*t^{15}$
$-1.3061750046371544$ $*10^{14}$ $*t^{16}$
$+1.9427512107279356$ $*10^{14}$ $*t^{17}$
$-2.4174491454303534$ $*10^{14}$ $*t^{18}$
$+2.521433305475022$ $*10^{14}$ $*t^{19}$
$-2.2039489104265897$ $*10^{14}$ $*t^{20}$ -continued

| | | |
|---|---|---|
| +1.610647269822348 | *10^14 | *r^21 |
| −9.79452464034434 | *10^13 | *r^22 |
| +4.918473437843539 | *10^13 | *r^23 |
| −2.0164417943710125 | *10^13 | *r^24 |
| +6.6376519280430625 | *10^12 | *r^25 |
| −1.711822118931248 | *10^12 | *r^26 |
| +3.33148649778159 | *10^11 | *r^27 |
| −4.601055874727744 | *10^10 | *r^28 |
| +4.0196966016458015 | *10^9 | *r^29 |
| −1.6704745817140442 | *10^8 | *r^30 |

Figure 25:
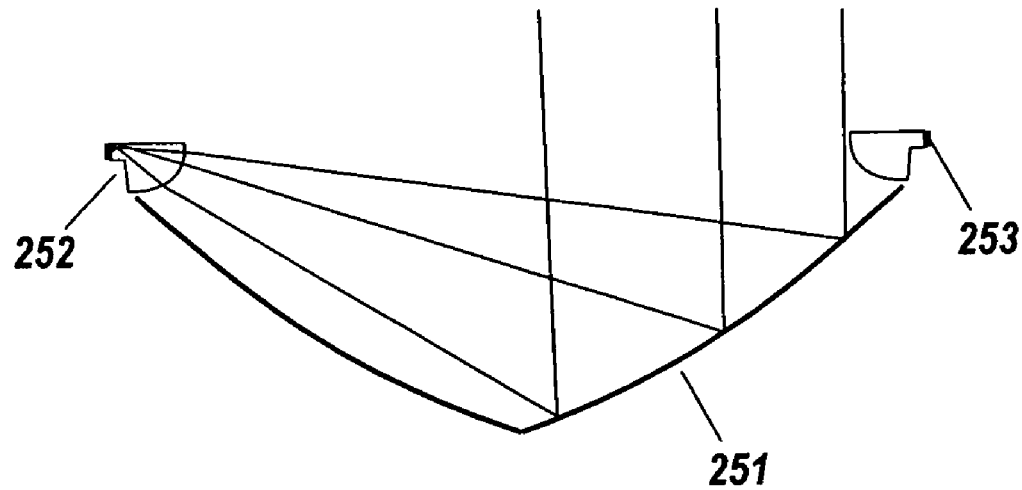
FIG. 25 is a cross-sectional view through a further embodiment of a solar concentrator having two symmetrically arranged primary mirror surfaces each focusing light on a respective secondary lens.

FIG. 25 shows another embodiment of a solar concentrator, which has two symmetrically arranged off-axis primary minors 251. Each primary mirror 251 has a respective secondary lens 252 spaced apart from the lower edge of the primary mirror, with the primary mirror of the symmetric system placed in between. This geometry allows for the two mirrors 251 to be manufactured as a single piece. Either a parallel-sided or a tapered rod 253 may be used. In the case shown in FIG. 25, each secondary lens 252 is a quarter-globe lens with its optical axis perpendicular to the plane of symmetry of the two optical systems, and a reflecting upper surface, which acts as a flow-line mirror.

Figure 26:
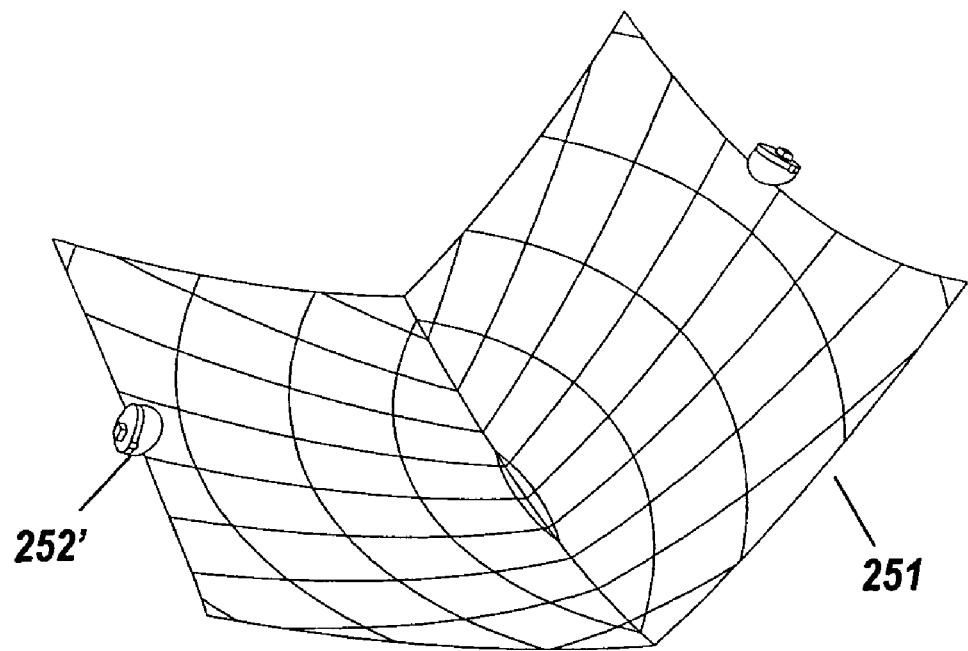
FIG. 26 is a perspective view of the mirrors and lenses of the solar concentrator shown in FIG. 25.

FIG. 26 shows a perspective view of a solar concentrator similar to that of FIG. 25, but with half-round secondary lenses 252' oriented with the optical axis of each secondary lens aimed approximately at the middle of its respective primary mirror 251, similarly to the configuration shown in FIG. 2.

Figure 27:
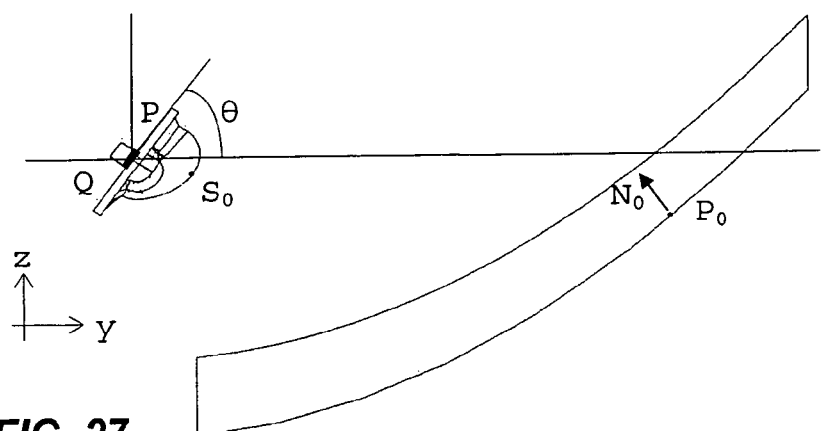
FIG. 27 is a side view of a further embodiment of a solar concentrator system with main input parameters marked for an SMS-3D algorithm generating embodiments of the present invention.

Referring now to FIGS. 27 to 34, a further embodiment of a solar concentrator is described. The following method can be used to calculate the asymmetric XR concentrator:

Step 1. The following input parameters are selected, as shown in FIG. 27:

the secondary lens refraction index n;
the inclination angle $\theta$ of the receiver with respect to the x-y plane (positive as shown in FIG. 27;
an initial point $P_0=(0, y_{P0}, z_{P0})$ on the mirror, and the normal vector $N_0$ to the mirror at $P_0$, in this example parallel to plane x=0;
the y-coordinate $y_{S0}$ of a point $S_o$ on the lens;
the rod input aperture length, which is segment PQ;
the acceptance angle $\alpha$, which is determined by the étendue conservation law assuming that the span of the mirror on the y-dimension is approximately $y_{P0}-y_{S0}$, so $\alpha=\arcsin(n(y_{P0}-y_{S0})\sin(\beta)/|PQ|)$; and
a factor b<1, which may be useful to adjust the density of calculated points, as explained below.

Figure 28:
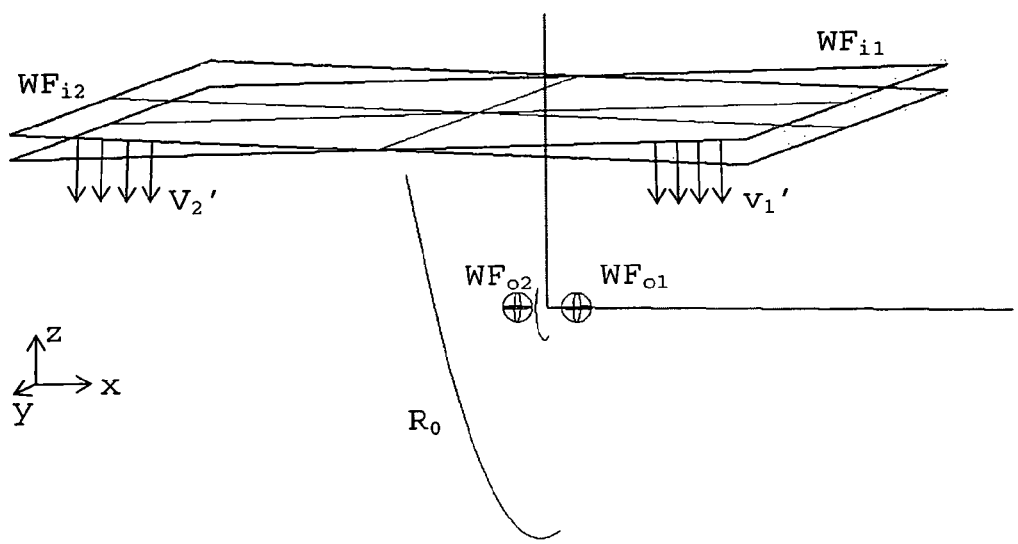
FIG. 28 shows the selected SMS-3D input parameters for the algorithm of FIG. 27.

Step 2. The input data for an SMS 3D design are selected as shown in FIG. 28:

Step 2.1. The input and output wavefronts $WF_{i1}$, $WF_{\alpha 1}$, and the optical path length $L_1$ between them, are specified. $WF_{i1}$ is a flat wavefront whose rays point in the direction $v_1'=(p', q', -(1-p'^2-q'^2)^{1/2})$, with $(p',q')=(+b\sin(\alpha),+b\sin(\alpha))$. $WF_{o1}$ is a spherical wavefront centered at the point $(x,y,z)=(b|PQ|/2, b\cos\theta|PQ|/2, b\sin\theta|PQ|/2)$.

The optical path length $L_1$ between wavefronts $WF_{i1}$ and $WF_{o1}$ is calculated using the condition that the ray of $WF_{i1}$ impinging on $P_0$ of FIG. 27 will be reflected towards $S_0$ and then refracted there to become a ray of $WF_{o1}$. Before calculating $L_1$, the coordinates of point $S_0$ of FIG. 27 must be calculated by reflection of the ray of $WF_{i1}$ on $P_0$ (note that the normal vector $N_0$ at $P_0$ was specified as input datum), and intersecting that reflected ray with the plane $y=y_{S0}$ (since $y_{S0}$ was also given). Typically $x_{S0}\neq 0$. Then, $L_1$ is calculated as:

$$L_1 = d(P_0, WF_{i1}) + d(S_0, P_0) + d(S_0, WF_{o1})*\eta,$$

where
$d(P_0, WF_{i1})$ is the optical path length between the mirror's initial point $P_0$ and the wavefront $WF_{i1}$;
$d(S_0, WF_{o1})$ is the optical path length between the lens's initial point $S_0$ and the wavefront $WF_{o1}$; and
$d(S_0, P_0)$ is the optical path length between the points $S_0$ and $P_0$.

The absolute positions of $WF_{i1}$ and $WF_{o1}$ are not defined, but that does not affect the calculation.

Step 2.2. The input and output wavefronts $WF_{i2}$, $WF_{o2}$ are selected, in this example, as symmetric to $WF_{i1}$ and $WF_{o1}$ with respect to plane x=0. Then, $WF_{i2}$ is a flat wavefront whose rays point in the direction $v_2'=(p',q',-(1-p'^2-q'^2)^{1/2})$, with $(p',q')=(-b\sin(\alpha), +b\sin(\alpha))$. $WF_{o2}$ is a spherical wavefront centered at the point $(x,y,z)=(-b|PQ|/2, b\cos\theta|PQ|/2, b\sin\theta|PQ|/2)$. The optical path length $L_2$ fulfills $L_2=L_1$ in this x-symmetric example.

Step 2.3. A seed rib, $R_0$ and the reference to the surface where we want the side rib to be are calculated as follows. The seed rib $R_0$ can be obtained by an SMS 2D calculation in plane x=0 using two pairs of wavefronts $WF_{i3}$, $WF_{o3}$ and $WF_{i4}$, $WF_{o4}$ as shown in FIG. 29. $WF_{i3}$, is a flat wavefront whose rays point in the direction $v_3'=(p',q',-(1-p'^2-q'^2)^{1/2})$, with $(p',q')=(0,+b\sin(\alpha))$ and it couples $WF_{o3}$ which is a spherical wavefront centered at the point $(x,y,z)=(0, b\cos\theta|PQ|/2, b\sin\theta|PQ|/2)$. $WF_{i4}$ is a flat wavefront whose rays point in the direction $v_4'=(p', q', -(1-p'^2-q'^2)^{1/2})$, with $(p',q')=(0,-b\sin(\alpha))$ and it couples $WF_{o4}$ which is spherical wavefront centered at the point $(x,y,z)=(0,-b\cos\theta|PQ|/2, -b\sin\theta|PQ|/2)$. For simplicity, a single b parameter is used everywhere. The optical path lengths $L_3$ between wavefronts $WF_{i3}$ and $WF_{o3}$ can be selected equal to $L_1$ and $L_2$. An optical path length $L_4$ between wavefronts $WF_{i4}$ and $WF_{o4}$ is chosen (and its value will be adjusted next).

FIGS. 30 and 31 show the relative positions of the four out wavefronts $WF_{o1}$, $WF_{o2}$, $WF_{o3}$, $WF_{o4}$, relative to the input end of the rod 301. FIG. 30 is a view along the z axis, FIG. 31 is a view along the x axis.

Figure 32:
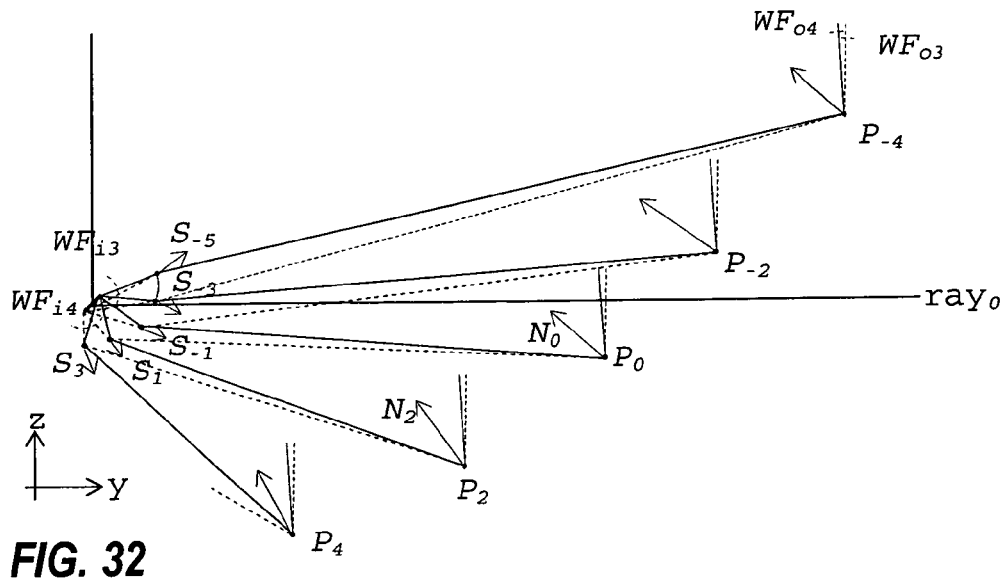
FIG. 32 is a diagram of the mathematical steps of the SMS algorithm of FIG. 27.

Step 3. Referring to FIG. 32, the initial curve, i.e., the seed rib $R_0$, is designed:

Step 3.1. Trace the ray of the wavefront $WF_{i3}$ passing through initial point $P_0$ of the mirror surface X. Since the normal $N_0$ is known, we can compute the reflection of that ray at $P_0$.

Step 3.2. Calculate the point $S_1$ along that ray trajectory after refraction at $P_0$ such that the optical path length from the wavefront $WF_{i3}$ to the wavefront $WF_{o3}$ is $L_3$.

Step 3.3. Once $S_1$ has been calculated, since the ray trajectory $P_0$ after and before the refraction at $S_1$ is known, we can calculate the normal vector $N_1$ to the surface R at point $P_1$ by inverting the Snell law.

Step 3.4. Once $S_1$ and $N_1$ have been calculated the procedure is repeated starting at $S_1$ and tracing backward the ray from $WF_{o4}$ passing through $S_1$. With a similar procedure to that described above, the point $P_2$ of the surface X is calculated using $L_4$ as optical path length from the wavefront $WF_{i4}$ to the wavefront $WF_{o4}$. After that, the normal $N_2$ to the surface X at the $P_2$ point can be calculated. Interpolate a low-order curve between $P_0$ and $P_2$ compatible with $N_0$ and $N_2$ (i.e., a curve perpendicular to normal vectors $N_0$ and $N_2$; for instance, a Hermite interpolating polynomial). Iterate over the value of $L_4$ (i.e. go back to Step 2.3) to make this interpolating curve as smooth as possible.

The calculation of points can be repeated to get a sequence of points (and normal vectors), called SMS sequence, of both surfaces in the x=0 plane. Global interpolating curves are computed (separately for each surface) and the one corresponding to the sequence of points on the mirror is called seed rib $R_0$. $R_0$ will be the input data for the further SMS 3D surface generation process.

Step 4. The resulting optical system will couple the rays of the wavefronts $WF_{i1}$ with $WF_{o1}$, and $WF_{i2}$ with $WF_{o2}$ and will consist of two surfaces R and X, where X contains curve $R_0$. This surface calculation is described next and illustrated in FIGS. 33 and 34.

The normal vectors to the mirror on points of the curve $R_0$ are also selected. Such a selection must be consistent with the constraint that these normal vectors are perpendicular to the curve $R_0$. Assume that an SMS chain can be generated from any point M of the curve $R_0$ using the described procedure, but now for wavefronts $WF_{i1}$ with $WF_{o1}$, and $WF_{i2}$ with $WF_{o2}$. The set of points generated from all the points of $R_0$, at the first step of the SMS chain generation, form another curve $R_1$ on the lens. Note that the calculation of the curve $R_1$ is the calculation of a curve contained in a generalized Cartesian oval surface when a one-parameter set of rays of one of the wavefronts is known (the one-parameter set of rays is formed by the rays of $WF_{i1}$ after reflection at the curve $R_0$).

Figure 33:
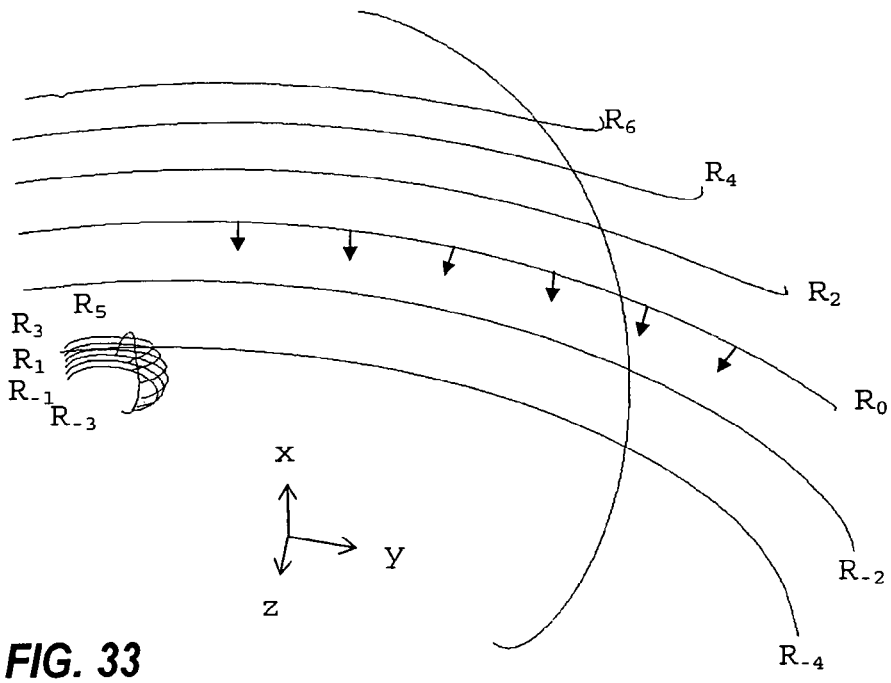
FIG. 33 is a diagram showing SMS ribs for the asymmetric design according to the algorithm of FIG. 27.
Figure 34:
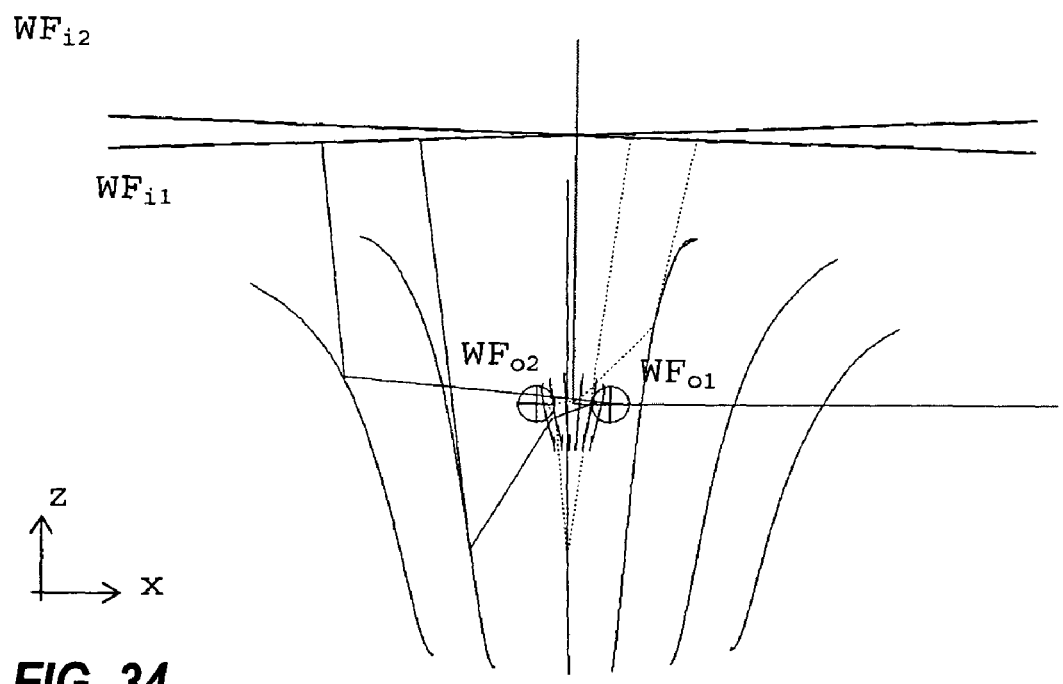
FIG. 34 is a diagram showing generated ribs for the asymmetric design according to the algorithm of FIG. 27.

Subsequent steps will produce curves $R_{2i}$ belonging to the mirror surface and curves $R_{2i+1}$ belonging to the lens surface, as well as the normals to the surfaces along those curves. The curves together with their surface normals will be called SMS ribs henceforth. The SMS ribs are shown in FIG. 33, and run alongside each other and transverse to the ribs shown in FIG. 34.

The surfaces of the mirror and lens are calculated as an interpolating surface of the SMS ribs (consistent with the normal vector). Such an interpolation can be easily done, for instance, using a loft surface interpolation available in most CAD packages.

Assume that the equation of the seed rib curve $R_0$ is given in parametric form as $P=R_0(u)$. A natural parameterization $P=R_i(u)$ is induced in the other rib curves generated by the SMS method. With this parameterization, points corresponding to the same u value are points that belong to the same SMS chain, i.e., each value of u defines an SMS chain.

The parameter b<1 set at the beginning can be used to select the number of points along the seed rib and the number of ribs to be designed (the smaller b, the higher the number of points and ribs).

Although specific embodiments have been described, the skilled reader will understand how features of different embodiments may be combined and substituted, and such combinations are within the scope of the present invention.

For example, as discussed above, the embodiments shown in the drawings are primarily based on designing the secondary lens 12 for glass with a refractive index of 1.52 Alternatively, a different material, such as glass with a refractive index of 1.83, may be used. The very high refractive index improves the TIR acceptance angle of the rod, as well as allowing a lower profile for the lens. The high index also opens the possibility of improving the optics by, for example, minimal or at least substantially reduced truncation of a circular aperture of a rotationally symmetric design.

However, there are possible offsetting disadvantages. First, in practical embodiments the rod exit is typically glued to the actual photovoltaic cell with a transparent, stable elastomeric material, which will then be of lower refractive index. The reliable glues presently available for this application are silicones with n<1.54. Because of the low-index glue layer, the lens to cell interface will have higher Fresnel reflection losses unless a sophisticated anti-reflection coating is applied at the rod exit. Second, if the difference in refractive index between the rod and the elastomeric glue is large enough, the TIR critical angle at that interface may become the limiting angle for the acceptance of the rod, i.e, a new restrictive cone appears. Third, the Fresnel reflection at the active lens surface is also higher, and if that surface has an anti-reflective coating more layers are needed to lower the reflectivity. The skilled person understands how to select an appropriate compromise among these competing considerations in a specific case.

Although the described embodiments have mirror and lens surfaces shaped to concentrate the incident light in two dimensions, the skilled reader will understand how to apply the present teachings to construct a mirror and lens surface shaped to concentrate the incident light in one dimension along the length of a trough-like concentrator. Such concentrators are easier to operate; if the concentrator is aligned equatorially, the only tracking required is adjustment of elevation according to the time of year. However, trough concentrators do not easily provide the very high concentration factors that can be achieved by concentrating in two dimensions.

Although the described embodiments are solar concentrators for photovoltaic solar power generation, the optics of the present application may be used for other purposes. In addition, the embodiments presented here may be used for the reverse application as an emitting device by replacing the photovoltaic cell by a source such as one or a cluster of light emitting diode (LED) sources. Such a device is especially applicable to thin-film high flux LEDs and packages, which can be obtained in a form that is well adjusted to be coupled to the rod. This rod would act as a homogenizer that makes luminance variation on the LED plane invisible, or at least less noticeable, in the output radiation, by doing so allows for tolerance in LED positioning without affecting the exit intensity pattern, and can even act as a color mixer if different color LEDs are used. The coupling of the LEDs and the rod could be done with an airgap, so that collimation at this end of the rod will occur, or with an index matching gel or adhesive. In this last case, if no mirror coating is to be applied, the use of a high refractive index rod (either glass or plastic) is preferred for maximizing the LED light collection by TIR. The choice of coupling may depend on the angular distribution of the emission from the LEDs.

Although glass lenses and rods have been described, other materials may be used. For example, in some emitter applications the lens and rod could be made by plastic injection using a plastic material the UV stability of which would not be satisfactory in a solar concentrator.

The preceding description of the presently contemplated best mode of practicing the invention is not to be taken in a limiting sense, but is made merely for the purpose of describing the general principles of the invention. The full scope of the invention should be determined with reference to the Claims.

We claim:
1. An optical concentrator comprising:
a concave primary mirror arranged to reflect collimated incident light to a primary focal region;
a secondary refracting lens disposed at the primary focal region of said primary mirror, said secondary lens comprising a rear surface having a light-conducting solid rod of square cross section protruding from and bordered by said rear surface and a front surface to, receive said reflected light and refract said light towards said rod, the width of the rod being less than the width of the secondary lens;

said rod having a reflective lateral surface and a distal end; and an optical transducer optically adhered to said distal end of said rod to receive said refracted light from said secondary lens through said rod.

2. A concentrator according to claim 1, which is at least one of a photovoltaic concentrator wherein the optical transducer is a photovoltaic cell and a collimating emitter wherein the optical transducer is a light source.

3. A concentrator according to claim 2 that is a photovoltaic concentrator wherein the optical transducer is a photovoltaic cell, and that is suitable for use as a solar power generator.

4. A concentrator according to claim 1, wherein said rod is parallel sided or tapered and has a uniform cross sectional shape along its length.

5. A concentrator according to claim 4, wherein said rod has a cross section substantially identical to a shape of a light-receiving area of said optical transducer.

6. A concentrator according to claim 1, wherein said rod has a length less than twice the minimum width of the rod at an entry end of the rod.

7. A concentrator according to claim 1, wherein said primary mirror and said front surface of said secondary lens form an essentially aplanatic system with focal plane essentially at the entry of the rod such that any axial ray entering the system, when traced through the system, reaches an entry plane of the rod at a point offset by less than 0.25 times the minimum rod entry width from the point at which the corresponding ray in an exactly aplanatic system would reach the entry plane of the rod.

8. A concentrator according to claim 1, wherein said primary mirror surface is a portion of a rotationally symmetric surface.

9. A concentrator according to claim 1, wherein at least a central portion of the front surface of said secondary lens can be substantially represented by a polynomial $z=f(r)$ with a non-null first order term representing a discontinuity of the first derivative of z at the origin.

10. A concentrator according to claim 1, wherein for light incident parallel to a principal axis of the primary mirror and reaching the distal end of the rod, the maximum angle of deflection at the primary mirror is at least 90°.

11. A concentrator according to claim 1, wherein ignoring losses the proportion of incident collimated light power reaching the distal end of the rod is at least 70% for all directions of incidence within an angle $\alpha=\arcsin(n \sin \beta/C_g^{1/2})$ of a primary axis, where n is the refractive index of a medium forming the rod, $\beta=90°-\arcsin(1/n)$ is the maximum angle at which light rays are totally internally reflected within the light conducting rod, and $C_g$ is the geometrical concentration of the concentrator.

12. A concentrator according to claim 1, wherein the geometrical concentration is at least 800× and for incident light having the geometrical properties of direct sunlight the proportion of incident light power reaching the distal end of the rod is at least 90% of a maximum value for all directions of incidence within 1.8° of a primary axis.

13. A concentrator according to claim 1, wherein for light incident parallel to a primary axis the maximum intensity of light at the distal end of the rod does not exceed four times the average intensity of light at the distal end of the rod.

14. A concentrator according to claim 1, wherein the solid rod is a rod of dielectric material and is totally internally reflecting for direct sunlight incident on the primary mirror with the sun centered on a primary axis.

15. A concentrator according to claim 1, wherein for direct solar illumination of the primary mirror with the sun centered on a principal axis the average light intensity on the transducer is at least 200 times the intensity of the incident illumination.

16. A photovoltaic concentrator comprising: first and second concave primary mirrors arranged symmetrically;

first and second secondary refracting lenses symmetrical with each other and respectively disposed at the primary focal regions of the first and second primary mirrors, said secondary lenses each comprising a rear surface having a square light-conducting rod protruding from said rear surface and a front surface to receive said reflected light and refract said light towards said rod;

said rods each having a lateral surface operative to reflect light and a distal end; and first and second transducers optically adhered to said distal end of said first and second rod, respectively, to receive the refracted light from the respective secondary lens;

wherein the first secondary lens is positioned at an edge of the second primary mirror furthest from the first primary mirror and the second secondary lens is positioned at an edge of the first primary mirror furthest from the second primary mirror.

17. A photovoltaic collector comprising one or more platforms rotatable in azimuth carrying a plurality of devices rotatable in altitude, each said device comprising a row of concentrators according to claim 2 arrayed along an altitude axis, and said plurality of devices arranged with the rows of concentrators side by side.

18. A concentrator according to claim 16, wherein the first and second primary mirrors adjoin along edges opposite to the said edges.

19. A concentrator according to claim 1, wherein the secondary refracting lens is offset laterally from a primary axis passing through a center of the concave primary mirror parallel to the collimated incident light.

20. A concentrator according to claim 19, wherein the secondary refracting lens is positioned outside the path of the collimated incident light onto the primary mirror.

* * * * *